(12) United States Patent
Beaudin et al.

(10) Patent No.: US 8,004,371 B2
(45) Date of Patent: *Aug. 23, 2011

(54) BAND REJECT FILTERS

(75) Inventors: Steve Beaudin, Nepean (CA); Chun-Yun Jian, Ottawa (CA); Somsack Sychaleun, Kanata (CA)

(73) Assignee: Nortel Networks Limited, Mississauga, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/856,757

(22) Filed: Aug. 16, 2010

(65) Prior Publication Data

US 2010/0308911 A1    Dec. 9, 2010

Related U.S. Application Data

(63) Continuation of application No. 11/666,438, filed as application No. PCT/CA2005/001492 on Sep. 30, 2005, now Pat. No. 7,777,597.

(60) Provisional application No. 60/623,049, filed on Oct. 29, 2004.

(51) Int. Cl.
*H03H 9/74* (2006.01)
*H03H 9/76* (2006.01)
*H03H 9/54* (2006.01)
*H03H 9/64* (2006.01)
*H03F 3/60* (2006.01)
*H03F 3/68* (2006.01)

(52) U.S. Cl. ........ 333/133; 333/125; 333/136; 333/189; 333/193; 330/124 R; 330/286; 330/295; 330/302; 330/53

(58) Field of Classification Search .................. 333/100, 333/117, 124, 125, 127, 128, 133, 136, 187–189, 333/193–196; 330/295, 286, 302, 124 R, 330/53

See application file for complete search history.

(56) References Cited

U.S. PATENT DOCUMENTS

4,126,837 A    11/1978    Koyamada et al.
(Continued)

FOREIGN PATENT DOCUMENTS

EP    1 050 962 A    11/2000
(Continued)

OTHER PUBLICATIONS

Dustakar K. et al., "An HTS lumped-element notch filter", Microwave Symposium Digest, 2004 IEEE MTT-S International Fort Worth, TX, USA, Jun. 6-11, 2004, vol. 1, pp. 127-130.

*Primary Examiner* — Barbara Summons

(57) ABSTRACT

Distributed band reject filters are disclosed. A first radio frequency band reject filter is disclosed having a splitter having a first input port, a first output port and a second output port, the splitter being operable on an input signal applied to the first input port to provide a respective output signal proportional to the input signal at each of the first and second output ports, the output signals having a phase shift between 45 degrees and 135 degree with respect to the input signal, as well as first, second and third acoustic resonators coupled respectively to the first input port, the first output port and the second output port. A second radio frequency band reject filter is disclosed having a combiner having a first input port, a second input port and a first output port, the combiner being operable on an input signals applied to the first input port and the second input port to provide a respective output signal proportional to the input signals at the first output port, the output signal having a phase shift between 45 degrees and 135 degree with respect to the input signals, as well as first, second and third acoustic resonators coupled respectively to the first input port, the second input port and the first output port. Also disclosed are amplifiers that comprise such radio frequency band reject filters.

20 Claims, 20 Drawing Sheets

U.S. PATENT DOCUMENTS

| | | |
|---|---|---|
| 4,694,266 A | 9/1987 | Wright |
| 4,903,297 A | 2/1990 | Rist et al. |
| 5,077,545 A | 12/1991 | Gopani et al. |
| 5,617,065 A | 4/1997 | Dydyk |
| 6,310,422 B1 | 10/2001 | Satoh et al. |
| 6,404,302 B1 | 6/2002 | Satoh et al. |
| 6,489,862 B1 | 12/2002 | Frank |
| 7,084,718 B2 | 8/2006 | Nakamura et al. |
| 7,170,353 B2 * | 1/2007 | Amano ................... 330/295 |
| 7,777,597 B2 * | 8/2010 | Beaudin et al. ............ 333/189 |
| 2003/0160664 A1 | 8/2003 | Beaudin et al. |
| 2004/0051601 A1 | 3/2004 | Frank |
| 2004/0130411 A1 | 7/2004 | Beaudin et al. |

FOREIGN PATENT DOCUMENTS

| | | |
|---|---|---|
| GB | 2 170 358 A | 7/1986 |
| JP | 56-079502 | 6/1981 |
| JP | 57-136801 | 8/1982 |
| JP | 3-292010 A2 | 12/1991 |
| RU | 2 190 925 C1 * | 10/2002 |
| WO | 03/006977 A | 8/2003 |

* cited by examiner

BAND REJECT FILTERS

RELATED APPLICATIONS

This application is a continuation of U.S. patent application Ser. No. 11/666,438 filed on Nov. 8, 2007, now U.S. Pat. No. 7,777,597, and claims the benefit thereof, which claims the benefit of and is a National Phase Entry of International Application No. PCT/CA2005/001492filed on Sep. 30, 2005, which claims the benefit of U.S. Provisional Patent Application No. 60/623,049 filed on Oct. 29, 2004.

FIELD OF THE INVENTION

This invention relates generally to filtering, and in particular to band reject filters.

BACKGROUND

Surface acoustic wave (SAW) devices have been studied and gradually commercialised since the mid 1960s. Such devices typically have electrodes in the form of interlocked "fingers" (so-called inter-digital electrodes) formed on a piezoelectric substrate. When high frequency signals are applied to the input electrodes, mechanical vibrations in the form of travelling acoustic waves are generated in the piezoelectric substrate which are picked up by the output electrodes. Generally speaking, when the wavelength of the surface acoustic waves and the period of the electrode "fingers" are the same, the magnitude of the surface acoustic waves are at their greatest and the device has a low electrical impedance. The frequency band at which the impedance is low defines the "pass band". At other input frequencies, outside the pass band, the device appears to have a higher electrical impedance.

Thus, a so-called "SAW resonator filter" can be made to have a very precise and narrow (typically having a Q factor over 1000), band pass characteristic. Furthermore, since surface acoustic waves travel across the substrate 100000 times more slowly than the speed of electromagnetic waves, such devices are generally compact and implemented on a single die. In practice, such devices can be used in a ladder configuration (with a plurality of shunt and plurality of series resonator filters used together). This allows a combined band pass characteristic to be tuned as desired.

These types of devices have found many uses, but suffer from two significant disadvantages which prevent their use in some applications. Firstly, band pass filters produced using SAW resonators typically have relatively high insertion losses typically of a minimum of 1 or 2 dB. The state of the art presently is an insertion loss of about 1 dB in the pass band with a rejection of about 15 dB in the stop band for a single stage band pass ladder filter. The losses typically occur as a result of visco-elastic attenuations and/or mode conversions from SAW to bulk acoustic waves when the electrical energy is converted to acoustic energy and travels around the SAW filter cavity. Secondly, the power handling capability of SAW filters is limited. At high powers, the ultrasonic vibration to which the metallic electrodes are subjected eventually causes the metal grain boundaries to migrate. Thus, for example, at the present 1800, 1900 and 2100 MHz mobile communication bands, such filters are barely able to withstand the typical transmit powers of 500 mW to 1 W for the typical life of a handset. Furthermore, to achieve this modest power handling capability, very advanced material systems have been developed.

SAW band reject filters potentially offer a way forward. In a band reject filter, the magnitude of the impedance is greatest at the rejection frequency band. At other input frequencies, the pass band, the device has a low electrical impedance. Since a SAW band reject filter can be designed to behave as an interdigital transducer (IDT) capacitive element within its pass band, and only exhibit a strong acoustic response within its rejection band, it is possible for these filters to achieve very low insertion losses and handle significantly larger powers than corresponding band pass filters. At frequencies away from the rejection band (i.e. at the device's pass band) the acoustic response of the device is very weak and as such viscoelastic attenuation or acoustic mode conversions is very minimal and the attainable insertion loss is primarily limited by the Q of the few matching components and the IDT capacitor (SAW transducer). Furthermore, acousto-electric migration is no longer as significant an issue and hence the device is able to handle much more power and is primarily only limited by arcing across the IDT's. Despite the tremendous potential of SAW notch and band reject filters, relatively little work has been done on them to date.

C. S. Hartman produced some of the first publications on SAW notch filters, including U.S. Pat. No. 4,577,168, that issued Mar. 18, 1986, and C. S. Hartman, J. C. Andle and M. B. King "SAW Notch Filters," Proc. 1987 Ultrasonics Symposium, Vol. 1, pp. 131-138. Various techniques for implementing SAW notch filters were presented where the conductance within the pass band of a single-phase unidirectional transducer (SPUDT) was used as an impedance element to create a notch filter. One implementation employed the impedance of the SPUDT transducer in conjunction with a Radio Frequency (RF) transformer and other implementations replaced the capacitors in a bridge-T type notch filter with a SPUDT transducer impedance element.

A variation on this technique was presented in 1990 by Gopani et al. (S. Gopani and B. A. Horine "SAW Waveguide-Coupled Resonator Notch Filter" Ultrasonics Symposium, 1990), where a Two-Pole Waveguide Coupled Resonator was imbedded in an all pass network to implement a notch filter. A further modification was presented by Lorenz et al. in 1998 (P. A. Lorenz and D. F. Thompson, "Wide Bandwidth Low Cost SAW Notch Filters", Ultrasonics Symposium, 1998). This technique consisted of placing two single pole SAW resonators in series with a shunt inductor in between them to resonate out their static capacitances.

Leveraging the inherent advantages of band reject filters, the present inventors developed a band reject filter based on a SAW ladder filter (U.S. Pat. No. 6,710,677, issued Mar. 23, 2004, and S. Beaudin, C. Y. Jian and S. Sychaleun "A New SAW Band Reject Filter and its Applications in Wireless Systems", Ultrasonics Symposium, 2002). The design technique for this previous SAW band reject filter was based on the reverse of the very well known band pass ladder filter of Y. Sato, O. Ikata, T. Matsuda, T. Nishihara and T. Miyashita "Resonator-Type Low-Loss Filters," Proc. Int. Symp. SAW Devices for Mobile Comm., pp. 179-185, 1992.

In a band pass structure, one seeks to generate a pass band using the resonance of the series resonator and the anti-resonance of the shunt resonator. The insertion loss can be minimized by providing a very low series impedance and a very high shunt impedance. The inventors' previous band reject filter consisted primarily of generating a band reject filter by using the anti-resonance of the series resonator and the resonance of the shunt resonator where the depth of the rejection band was maximized by increasing the series impedance and minimizing the shunt impedance. For the well known pass band device, one seeks to optimize out of band rejection by minimizing the ratio of the series to shunt static capacitances. For the inventors' previous band reject filter, the opposite was true in that the inventors sought to minimize insertion loss by maximizing the ratio of the series to shunt static capacitances. It was noted that one can transform a pass band ladder filter into a corresponding band reject ladder filter very simply by inverting the shunt and series resonators in each arm of the ladder filter.

The resultant band reject filter was shown to provide very low insertion losses as well as being able to withstand substantially higher powers within its pass band. For example, some prototypes at 800 MHz have less than 0.5 dB of insertion loss in their pass band, provide >35 dB rejection in a rejection band and have withstood RF powers of 42 dBm for several weeks within their pass bands. The power handling capability is a full order of magnitude improved compared to a similar pass band SAW ladder filter of similar size.

Although filters of this type exhibit very low losses and high power handling capabilities, the design approach lacks flexibility where complex filter responses are desired. In order to generate a deep rejection band it is necessary to have a low impedance to ground working against a high series impedance. Both series and shunt resonators are used. The shunt resonator is used to generate a low RF impedance to ground at its resonance frequency and the anti-resonance of a series resonator is used to generate the high series impedance. Furthermore, to minimize loss in the pass band it is necessary to minimize the capacitance of the shunt resonator and maximize the capacitance of the series resonator, which introduce constraints on the resonator design. These filters are also generally intended for applications in which all filter components are in close proximity to each other, whereas many modern high frequency RF and microwave devices in which band reject filters could potentially be implemented often use distributed elements.

SUMMARY OF THE INVENTION

Embodiments of the present invention allow low cost technologies such as SAW or FBAR (thin Film Bulk Acoustic Resonators) to be used to design very low loss filters which can withstand very high RF powers. These filters may achieve sufficiently low loss to be used on the front end of a network element such as a BTS (Base Transceiver Station) in a communication system, an area which tended to be reserved exclusively to very expensive cavity or waveguide filters.

Distributed filter approaches as disclosed herein also allow a filter designer to generate a desired response using only series or only shunt resonators. The resonators need not be restricted to a single die. Phase shift elements such as impedance inverters enable high levels of rejection to be achieved and also improve the pass band response.

In general the desired phase shift is between 45° and 135° depending on whether one wishes to optimize for rejection band depth or pass band insertion loss. Rejection band depth may be optimized by an impedance inversion, i.e. a phase shift of approximately 90°. Pass band insertion loss may be optimized by phase shifting the impedance to its complex conjugate; the complex conjugate may occur at a phase shift of approximately 90° but the required phase shift may also be more or less, in the range of 45° to 135°. A natural matching occurs when the impedance, usually a capacitive load, of one resonator or group of resonators is rotated to present an impedance which is close to the complex conjugate of another resonator or group of resonators and as a result there is a natural matching which occurs in the desired pass band of the distributed band reject filter.

According to one aspect of the invention, there is provided a radio frequency band reject filter which includes a first acoustic resonator and a second acoustic resonator. Each of the first and second acoustic resonators has either shunt resonators adapted to resonate substantially at respective resonance frequencies defining a rejection frequency band or series resonators adapted to anti-resonate substantially at respective anti-resonance frequencies defining the rejection frequency band. The filter also includes a phase shifter connecting the first acoustic resonator and the second acoustic resonator and adapted to impart an impedance phase shift of between 45° and 135°.

A further aspect of the invention provides a method of filtering a signal comprising: passing the signal through a first acoustic resonator comprising either a shunt resonator adapted to resonate substantially at a resonance frequency defining a rejection frequency band or a series resonator adapted to anti-resonate substantially at an anti-resonance frequency defining the rejection frequency band; passing the signal through a phase shifter adapted to impart an impedance phase shift of between 45° and 135°; and passing the signal through a second acoustic resonator comprising a second acoustic resonator of the same shunt or series type as the first acoustic resonator.

Other aspects and features of embodiments of the present invention will become apparent to those ordinarily skilled in the art upon review of the following description of specific illustrative embodiments of the invention.

BRIEF DESCRIPTION OF THE DRAWINGS

Examples of embodiments of the invention will now be described in greater detail with reference to the accompanying drawings, in which.

DETAILED DESCRIPTION OF PREFERRED EMBODIMENTS

High frequency RF and microwave designs often use distributed elements. Band reject filter design can be made more versatile, with improved performance, by leveraging impedance inverters between adjacent resonators. One of the simplest forms of an impedance inverter is simply a transmission line with approximately 90° of phase shift at the desired frequency of operation. Impedance inverters can also be designed as discrete components using lumped elements at lower frequencies where the quarter-wavelength transmission line would be excessively large or where space is critical. The use of impedance inverters enables band reject filters to be created using exclusively shunt or exclusively series resonators. Furthermore, these band reject filters can be designed to utilize, as an impedance inverter, the quarter-wave transmission lines which are already present in elements such as a Quadrature coupler, Wilkinson combiner or Balun, all elements which already exist on some PA (Power Amplifier) and LNA (Low Noise Amplifier) boards. The phase shifter effectively acts as an impedance inverter, which enhances band reject depth and improves pass band match resulting in much improved overall performance. The need for discrete impedance matching components is also eliminated in some embodiments.

Figure 1:
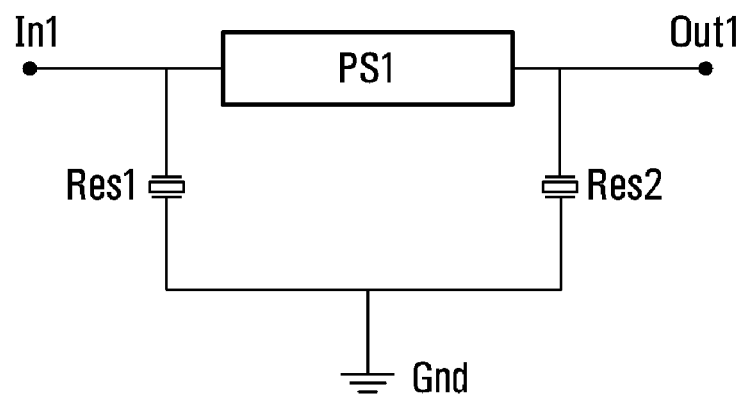
FIG. 1 is a schematic diagram of a band reject filter according to an embodiment of the invention.

FIG. 1 is a schematic diagram of a band reject filter according to an embodiment of the invention. The band reject filter of FIG. 1 includes shunt resonators Res1 and Res2 connected by a phase shifter PS1 between input port In1 and output port Out1. The shunt resonators Res1 and Res2 are also connected in parallel to ground Gnd. The shunt resonators Res1 and Res2 may be SAW resonators, FBARs, or BAW Resonators, for example. A transmission line having a length that is approximately ¼ wavelength at a representative wavelength in the rejection band or a Shiffman coupler, for instance, may be used as the phase shifter PS1, which acts as an impedance inverter.

In operation, shunt resonators Res1 and Res2 generate shorts to ground Gnd substantially at their respective resonance frequencies. Anti-resonance associated with the shunt resonators Res1 and Res2 generates a high impedance to ground Gnd and is not significant at frequencies other than respective anti-resonance frequencies of the shunt resonators Res1 and Res2. The phase shifter PS1 rotates the impedance of shunt resonator Res2 such that the resonance to ground (short circuit) of shunt resonator Res2 appears as a high series impedance from the point of view of shunt resonator Res1. The short to ground of shunt resonator Res1 is thus working against a high series impedance, which gives a deep rejection band.

In such a scenario the rejection band depth increases significantly. There is also a corresponding improvement in pass band response since the capacitive impedance of the shunt resonator Res2 within the pass band is rotated about the Smith chart (see FIGS. 19-24) and is now presenting an inductive impedance to the shunt resonator Res1. Pass band response can be optimize by adjusting the amount of phase shift such that the resonance of the shunt resonator Res2 is rotated to provide an impedance which is approximately the complex conjugate of the impedance of the shunt resonator Res1, resulting in a very flat, low loss pass band. The appropriate amount of phase shift can vary from 45° to 135°. The exact amount of phase shift needed to provide a complex conjugate match will vary from design to design but will be approximately 90°±45°. When a complex conjugate impedance match is achieved, the pass band response is optimized but it may be at a slight expense of the rejection band depth.

Ladder-type band reject filters generate high series impedance using anti-resonance of a series resonator. In the filter of FIG. 1, the combination of the shunt resonator Res2 and the phase shifter PS1 effectively generates a high series impedance.

Figure 2:
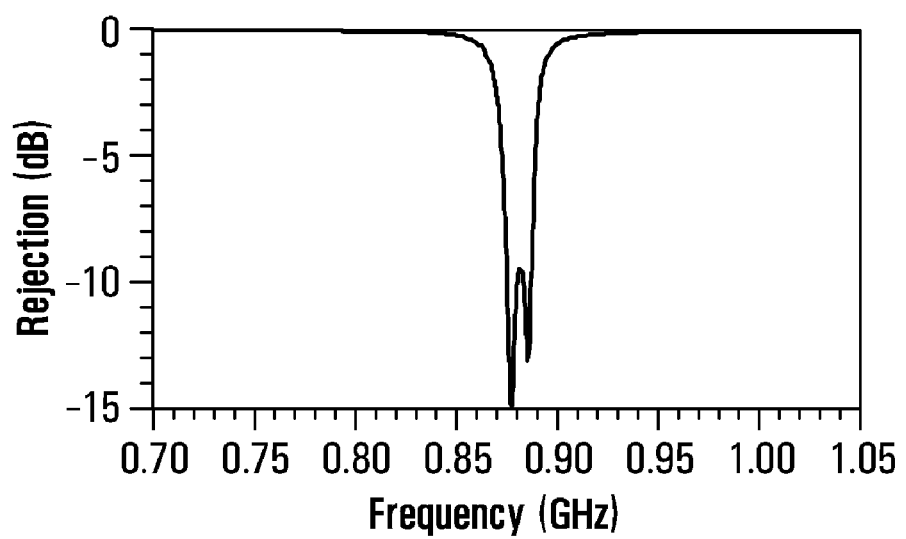
FIG. 2 illustrates a simulated response characteristic for a filter according to a filter of the type shown in FIG. 1.

FIG. 2 illustrates a simulated response characteristic for a filter according to the embodiment of the invention of FIG. 1. The rejection is shown as a function of frequency. It should be appreciated that the particular response characteristic shown in FIG. 2 is presented solely for illustrative purposes. Other response characteristics may be exhibited by filters according to other embodiments of the invention.

Figure 3:
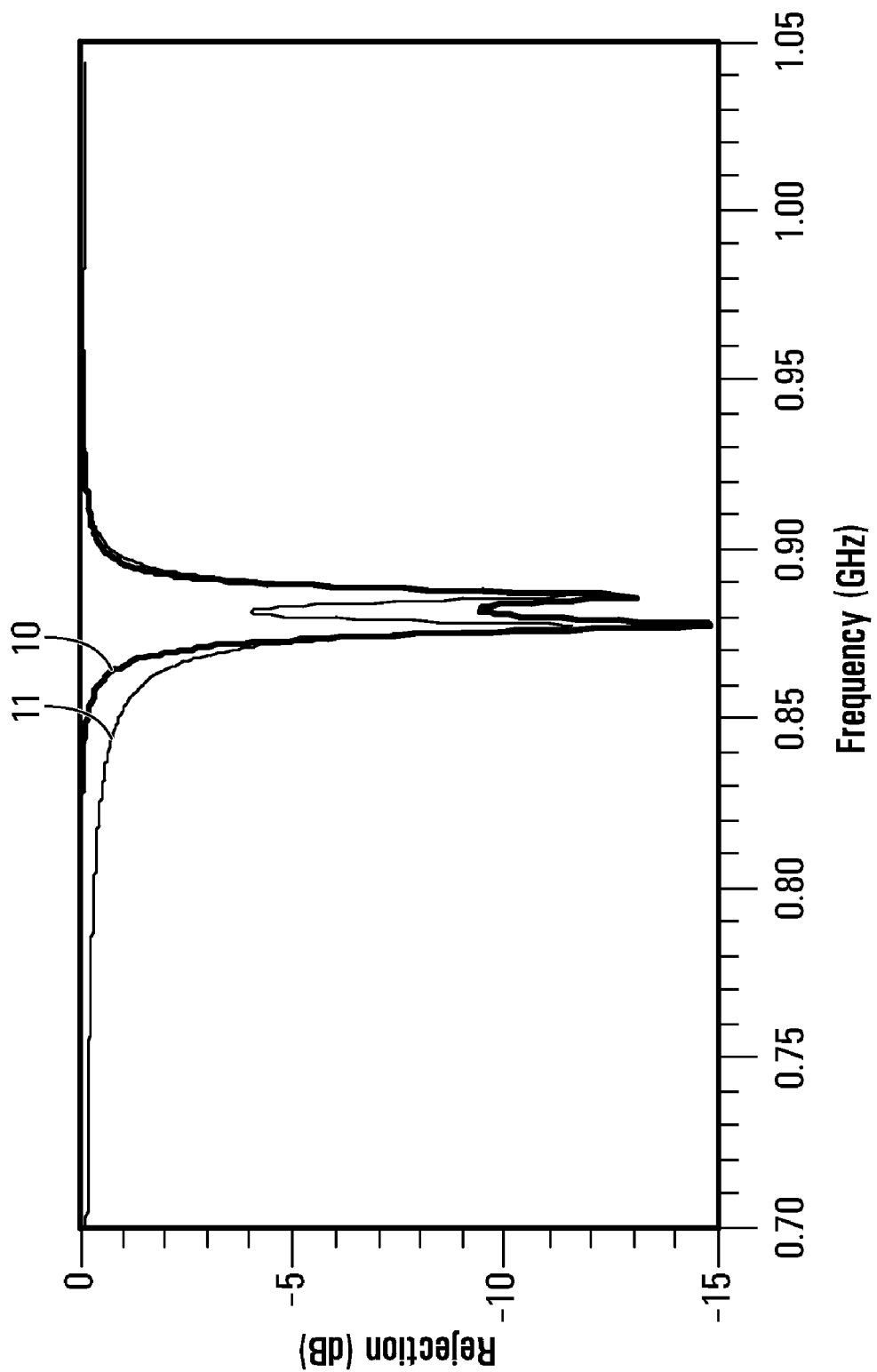
FIG. 3 illustrates simulated response characteristics for a filter of the type shown in FIG. 1 and a filter having identical resonators but no phase shifter.

FIG. 3 illustrates simulated response characteristics for a filter according to the embodiment of the invention shown in FIG. 1 and a filter having identical shunt resonators Res1 and Res2 but no phase shifter. A trace 10 having a steeper pass band to rejection band transition and a lower rejection band corresponds to a filter of the type shown in FIG. 1. A trace 11 corresponds to the filter having no phase shifter. Thus, it will be apparent that the phase shifter PS1 improves rejection and also improves pass band match.

Figure 4:
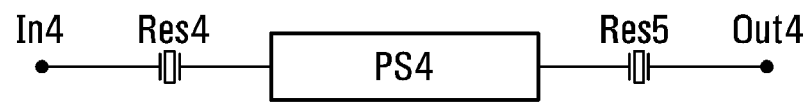
FIG. 4 is a schematic diagram of a band reject filter according to another embodiment of the invention.

FIG. 4 is a schematic diagram of a band reject filter according to another embodiment of the invention. The band reject filter of FIG. 4 includes series resonators Res4 and Res5 connected by a phase shifter PS4 between input port In4 and output port Out4. Thus, the series resonators Res4 and Res5 may be SAW or FBAR devices and the phase shifter PS4 may be a transmission line, discrete impedance inverter, or coupler, for example. A rejection band or notch is generated in the filter of FIG. 4 using high impedance anti-resonance of each of the series resonators Res4 and Res5 at substantially its respective anti-resonance frequency. The phase shifter PS4 rotates the impedance of one of the series resonators Res4 and Res5 with respect to the other such that an anti-resonance of each resonator is working against a low impedance, which provides improved rejection. Impedance rotation by the phase shifter PS4 also ensures good matching within the pass band.

Figure 5:
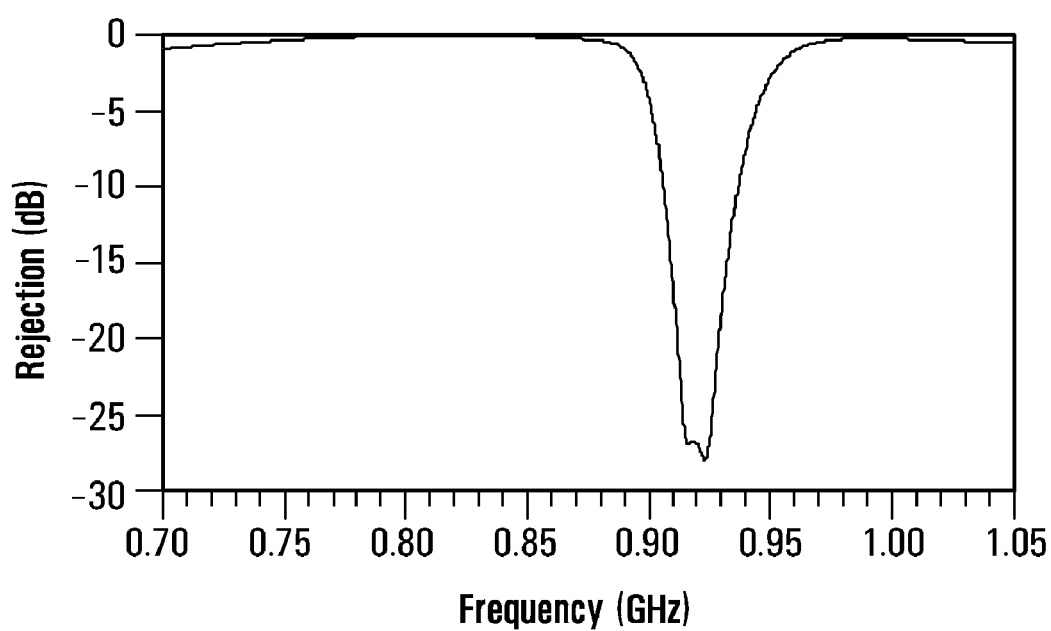
FIG. 5 illustrates a simulated response characteristic for a filter according to a filter of the type shown in FIG. 4.

FIG. 5 is a simulated response characteristic for a filter according to a filter of the type shown in FIG. 4. Of course, filters may be designed to exhibit desired response characteristics which may be different than the response characteristic shown in FIG. 5 and those in subsequent filter response plots described below.

Figure 6:
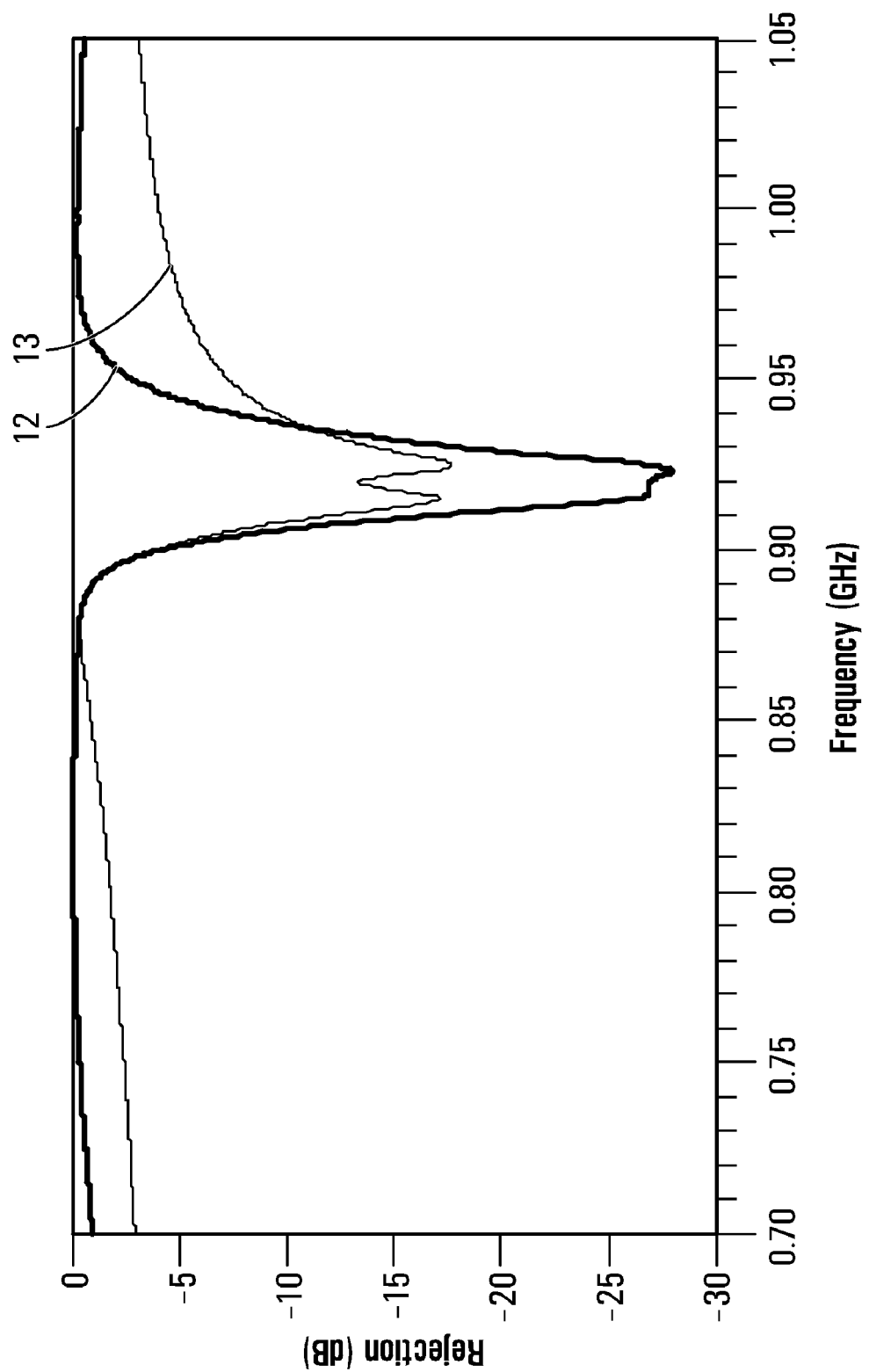
FIG. 6 illustrates simulated response characteristics for a filter of the type shown in FIG. 4 and a filter having identical resonators but no phase shifter.

FIG. 6 illustrates simulated response characteristics for a filter of the type shown in FIG. 4 and a filter having identical series resonators Res4 and Res5 but no phase shifter PS4. A trace 12 having a lower rejection band and steeper pass band to rejection band transition corresponds to a filter of the type shown in FIG. 4. A trace 13 corresponds to the filter having no phase shifter PS4. The effect of the phase shifter PS4 in the filter of FIG. 4 will be apparent from a comparison of the two traces 12 and 13 in FIG. 6. There is a significant improvement in rejection band depth as well as pass band loss and flatness.

Figure 7:
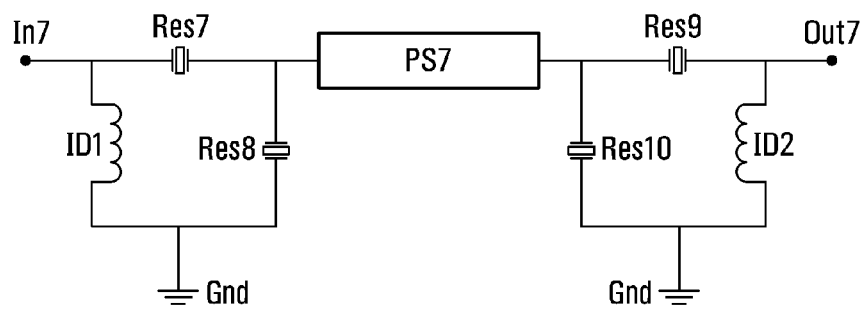
FIG. 7 is a schematic diagram of a band reject filter according to another embodiment of the invention.

FIG. 7 is a schematic diagram of a band reject filter according to another embodiment of the invention. The series-shunt band reject filter shown in FIG. 7 includes a series resonator Res7 and a shunt resonator Res8 comprising a first pair of resonators and a series resonator Res9 and a shunt resonator Res10 comprising a second pair of resonators. The series resonator Res7 connects to an input In7 and the series resonator Res9 connects to an output Out7. The shunt resonators Res8 and Res10 are both connected to ground Gnd. An inductor ID1 is also connected to the first pair of resonators and connects between the input In7 and ground Gnd. Similarly, an inductor ID2 is also connected to the second pair of resonators and connects between the output Out7 and ground Gnd. In this particular design the inductors are beneficial to improve pass band response by tuning out part of the capacitance of the resonator elements within the filter pass band. The first pair of resonators and the second pair of resonators are connected in series by a phase shifter PS7. The combination of inductors and phase shifter make it possible to provide an impedance inversion in the rejection band and a complex conjugate match in the pass band simultaneously.

The operation of the filter of FIG. 7 will be apparent from the foregoing description of the shunt and series filters of FIGS. 1 and 4. In particular, the phase shifter PS7 rotates the impedance of the shunt resonator Res10 such that the resonance to ground Gnd of shunt resonator Res10 appears as a high series impedance from the point of view of the shunt resonator Res8. The short to ground of the shunt resonator Res8 is thus working against a high series impedance. The phase shifter PS7 also rotates the impedance of the series resonator Res9 such that the anti-resonance of the series resonator Res7 is working against a low impedance to ground Gnd. The net result is to reverse the effective positions in the circuit of the resonators Res9 and Res10.

Figure 8:
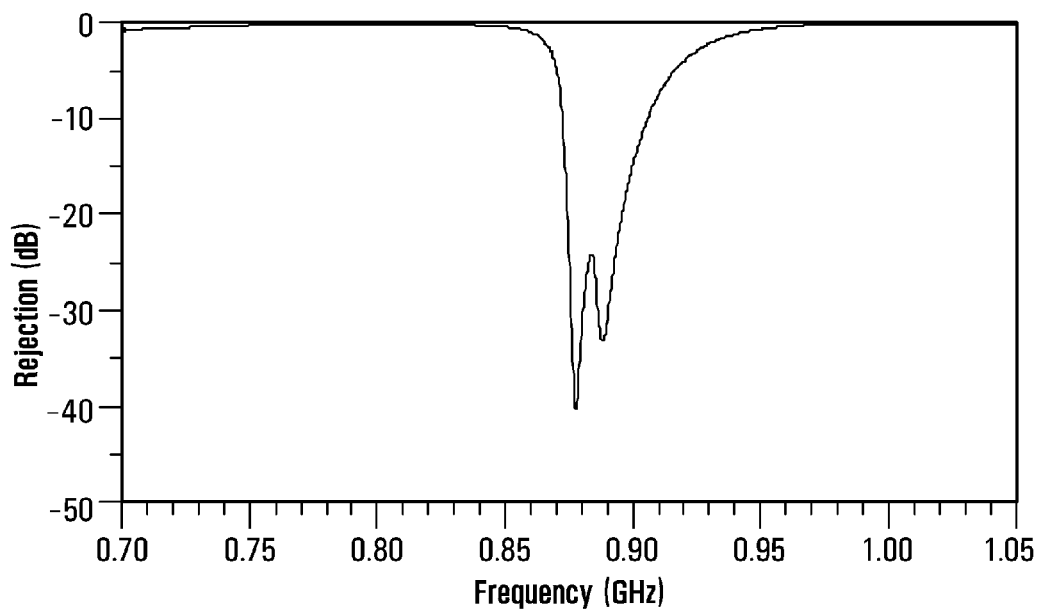
FIG. 8 illustrates a simulated response characteristic for a filter of the type shown in FIG. 7.

The response characteristic of FIG. 8 illustrates the good pass band match provided by utilizing the phase shifter PS7 in the filter of FIG. 7. Effective pass band complex conjugate impedance match provides low loss and makes matching using discrete components less critical.

Figure 9:
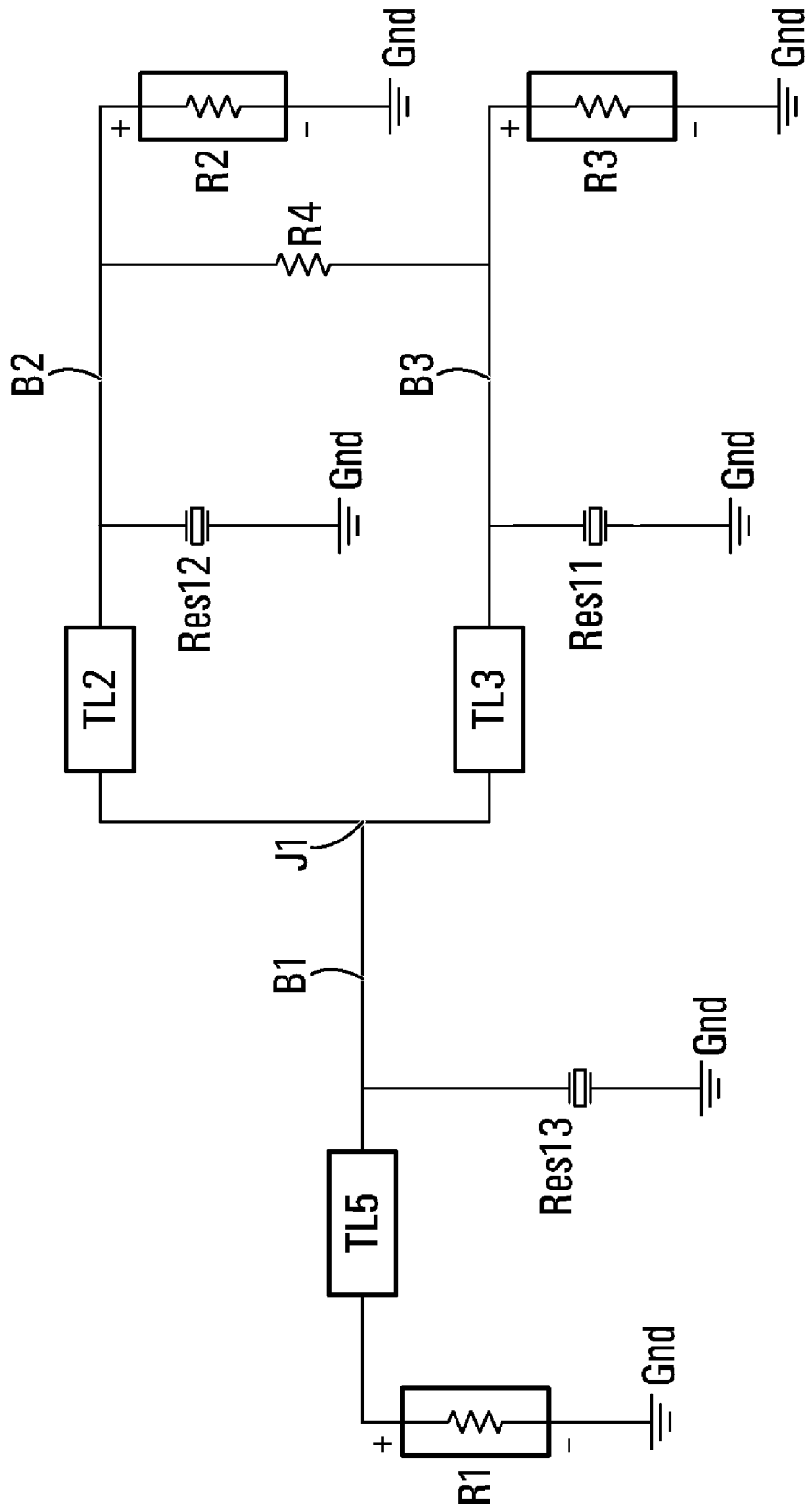
FIG. 9 is a schematic diagram of a band reject filter according to yet another embodiment of the invention.

FIG. 9 is a schematic diagram of a band reject filter according to yet another embodiment of the invention. The filter of FIG. 9 is a shunt band reject filter designed around a splitter/combiner, illustratively a Wilkinson splitter/combiner. The Wilkinson splitter/combiner circuit has input/output impedances R1, R2 and R3, in branches B1, B2 and B3, respectively, of equal nominal value, for example, 50 Ohms. These resistors are not part of the circuit but representative of the source and load impedances at the respective ports. A matching resistor R4, connected across the branches B2 and B3, has a nominal value twice that of the output load impedance, in this example, 100 Ohms. The input/output impedance R1 is connected by a transmission line TL5 to a junction J1 (Note that TL5 need not be in the circuit). The transmission line TL5 has a nominal impedance of 50 Ohms. The junction J1 connects to the input/output impedances R2 and R3 through quarter-wave transmission lines TL2 and TL3 in the branches B2 and B3. The quarter-wave transmission lines TL2 and TL3 have the same nominal impedance, in this example 70.7 Ohms, and provide a nominal phase shift of 90° at the desired rejection band frequency.

The quarter-wave transmission lines TL2 and TL3, because of their phase shift characteristics, can be used as a basis for a band reject filter. In particular, shunt resonators Res12 and Res11 have been added to the branches B2 and B3. A shunt resonator Res13 has been added to branch B1. The shunt resonator Res13 is located on the opposite side of the quarter-wave transmission lines TL2 and TL3 from the resonators Res12 and Res11. Thus the combination of the resonator Res13, the quarter-wave transmission line TL2 and the resonator Res12 act as a band reject filter in branch B2 and the combination of the resonator Res13, the quarter-wave transmission line TL3 and the resonator Res11 act as a band reject filter in branch B3. The operation of each band reject filter is as described with respect to FIG. 1.

In many cases, quarter-wave phase shifters are already provided in communication equipment in the form of Wilkinson dividers as in the example of FIG. 9. FIG. 9 describes how distributed band reject filters can also be designed into a Wilkinson divider by placing resonators on either end of the quarter-wave transmission lines. Band reject filters making use of quarter-wave lines which are already provided in communication equipment, on a PCB (Printed Circuit Board), for instance, reduce space requirements and loss associated with filter implementation.

Figure 10:
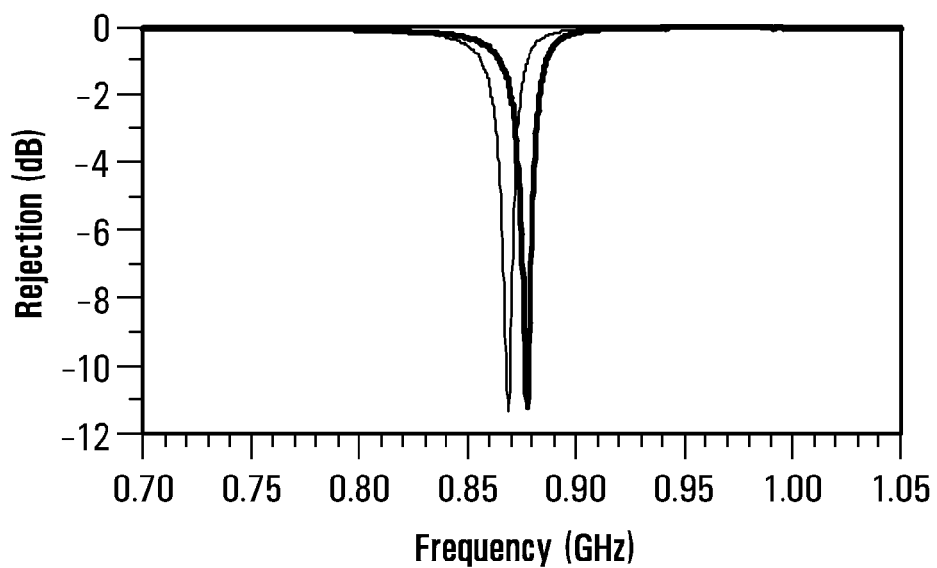
FIG. 10 illustrates a simulated response characteristic for a filter of the type shown in FIG. 9, without phase shifters.
Figure 11:
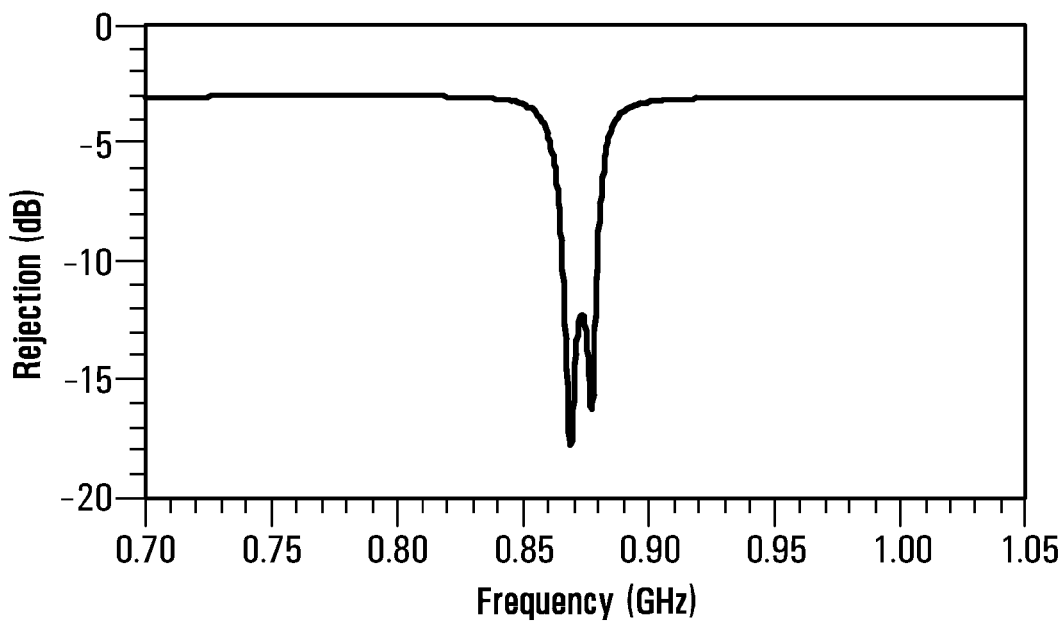
FIG. 11 illustrates a simulated response characteristic for a filter of the type shown in FIG. 9.

The effect of impedance inversion by the phase shifters in FIG. 9 is apparent from a comparison of FIGS. 10 and 11. FIG. 10 illustrates simulated response characteristics for Res13 and Res12 or Res11 individually. FIG. 11 illustrates a simulated filter response of the circuit shown in FIG. 9. The 3 dB loss in FIG. 11 is due to power splitting. Actual dissipated loss is on the order of 0.1 dB.

Figure 12:
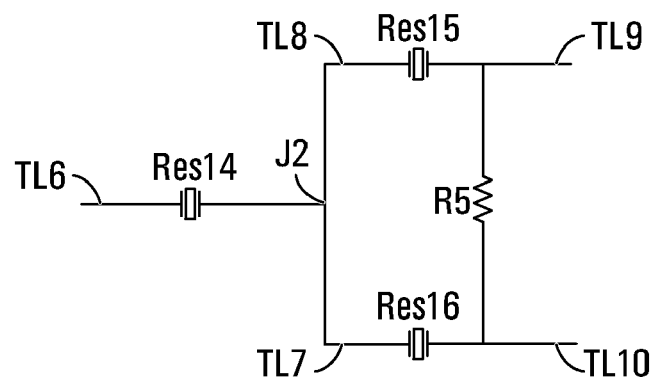
FIG. 12 is a schematic diagram of a band reject filter according to a further embodiment of the invention.
Figure 13:
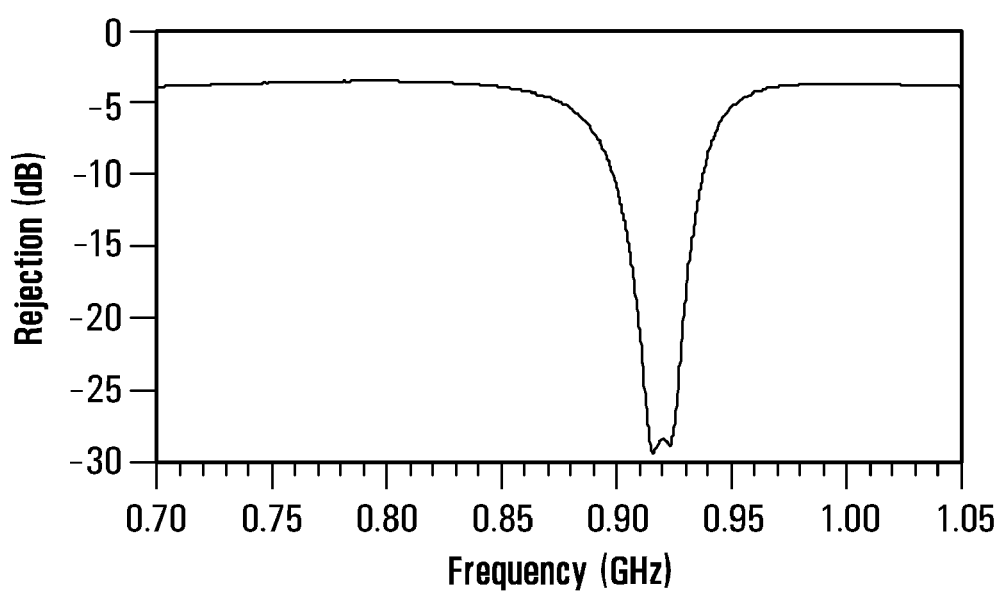
FIG. 13 illustrates a simulated response characteristic for a filter of the type shown in FIG. 12.

FIG. 12 is a schematic diagram of a band reject filter according to a further embodiment of the invention. The filter of FIG. 12 is based on a splitter, as is the filter of FIG. 9, but the filter of FIG. 12 is a series band reject filter. Input/output transmission lines TL6, TL9 and TL10 of FIG. 12 are nominally of 50 Ohms impedance. A matching resistor R5 is connected across the input/output transmission lines TL9 and TL10. Two quarter-wave transmission lines TL8 and TL7 of 70.70 hm nominal impedance connect at a junction J2. Three series resonators Res15, Res16 and Res14 are embedded into the splitter, with the series resonators Res15, Res16 and Res14 being connected by phase shifters, illustratively the quarter-wave transmission lines TL8 and TL7. The resulting series band reject filters operate as described with respect to FIG. 2. FIG. 13 is a simulated response characteristic for a filter of the type shown in FIG. 12.

Band reject filters may also be designed around a quadrature coupler, similar to the Wilkinson divider embodiments described above. Basically, pairings of series or shunt resonators would be distributed across the quadrature coupler, which provides a phase shift of 90°, to generate the rejection band.

Figure 14:
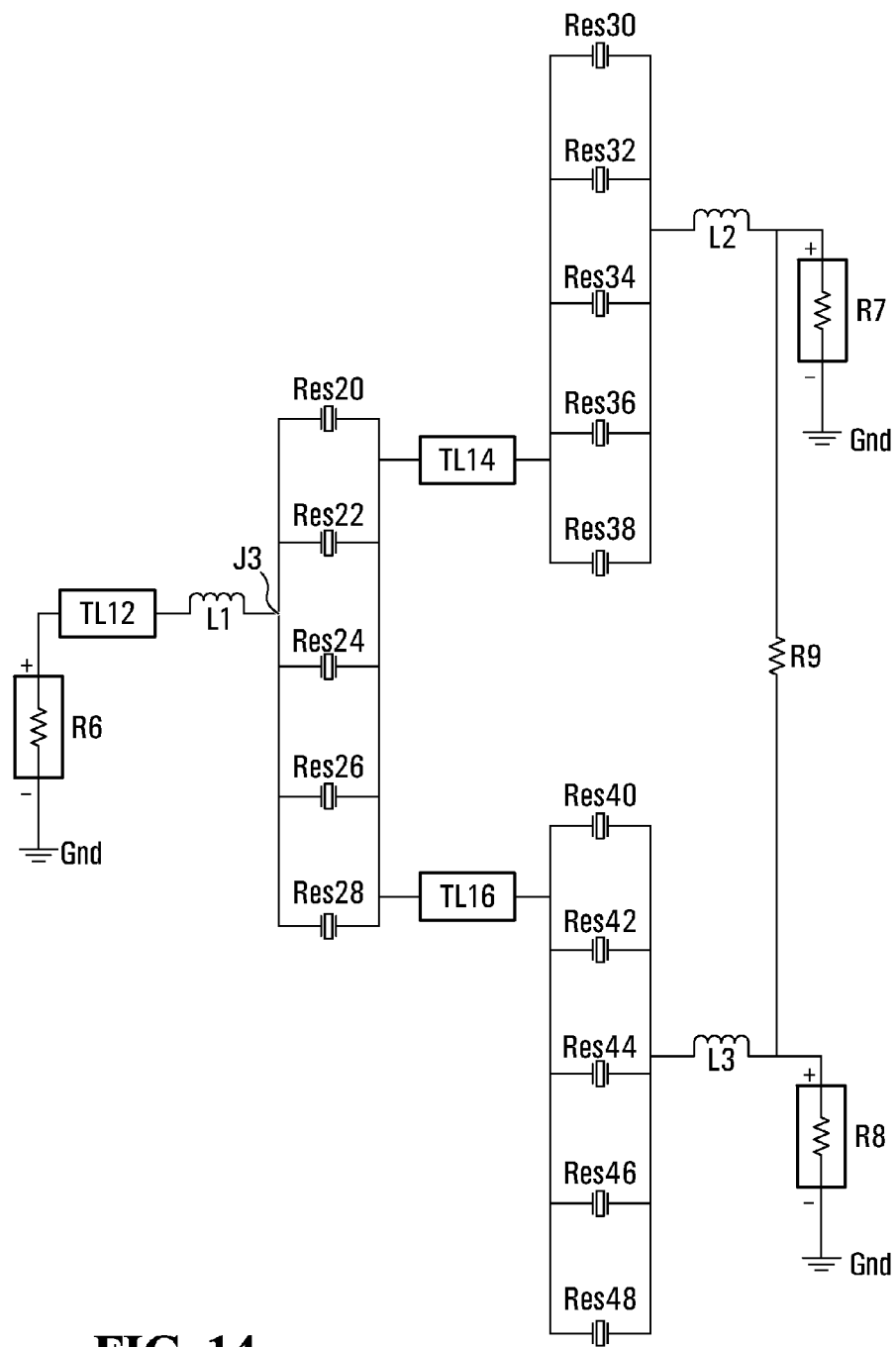
FIG. 14 is a schematic diagram of a band reject filter in accordance with a still further embodiment of the invention.

A further example of a series band reject filter embedded in a Wilkinson splitter is shown in FIG. 14. As above, input/output source and load impedances R6, R7 and R8 have the same nominal value. A matching resistor R9 connected across the branches of the splitter has twice the nominal impedance value of the input/output source and load impedances R6, R7 and R8. A Transmission line TL12 connects the input to a junction J3. Inductors L1, L2 and L3 are provided at the input and the output to improve pass band response. In this case, parallel groups of series resonators Res20 to Res28, Res30 to Res38, and Res40 to Res48 are provided. Connection of series resonators in parallel, as shown, increases the power handling capability of the filter. Quarter-wave transmission lines TL14 and TL16 separate the parallel groups of series resonators Res20 to Res28, Res30 to Res38, and Res40 to Res48. The quarter-wave transmission lines TL14 and TL16 provide a quarter-wave phase shift at the reject band to allow operation of the filter as described with respect to FIG. 4.

Figure 15:
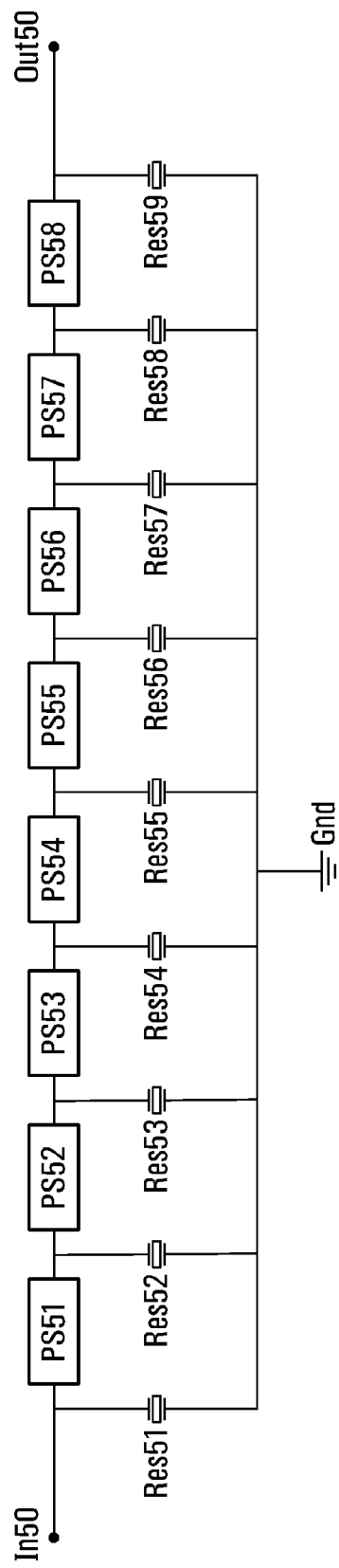
FIG. 15 is a schematic diagram of a shunt multipole band reject filter according to another embodiment of the invention.

FIG. 15 is a schematic diagram of a multipole filter according to another embodiment of the invention. M resonators, illustratively 9 shunt resonators Res51 to Res59 in FIG. 15, are connected by M−1 phase shifters, illustratively 8 phase shifters PS51 to PS58 in FIG. 15. The shunt resonators Res51 to Res59 are shunted to ground Gnd and connect across an input In50 to an output Out50. FIG. 15 illustrates that the filter can be cascaded and tailored to particular requirements. The multipole filter operates in a substantially similar manner as the shunt filter described in respect to FIG. 1.

Very complex filters can be constructed using multiple phase shifters PS51 to PS58 as shown in FIG. 15. This type of filter structure may also provide rejection over a relatively wide bandwidth by tuning each of the resonators Res51 to Res59 to a slightly different resonance frequency to increase rejection bandwidth. More resonators can be concentrated over a specific frequency range if enhanced rejection in that frequency range is needed.

Figure 16:
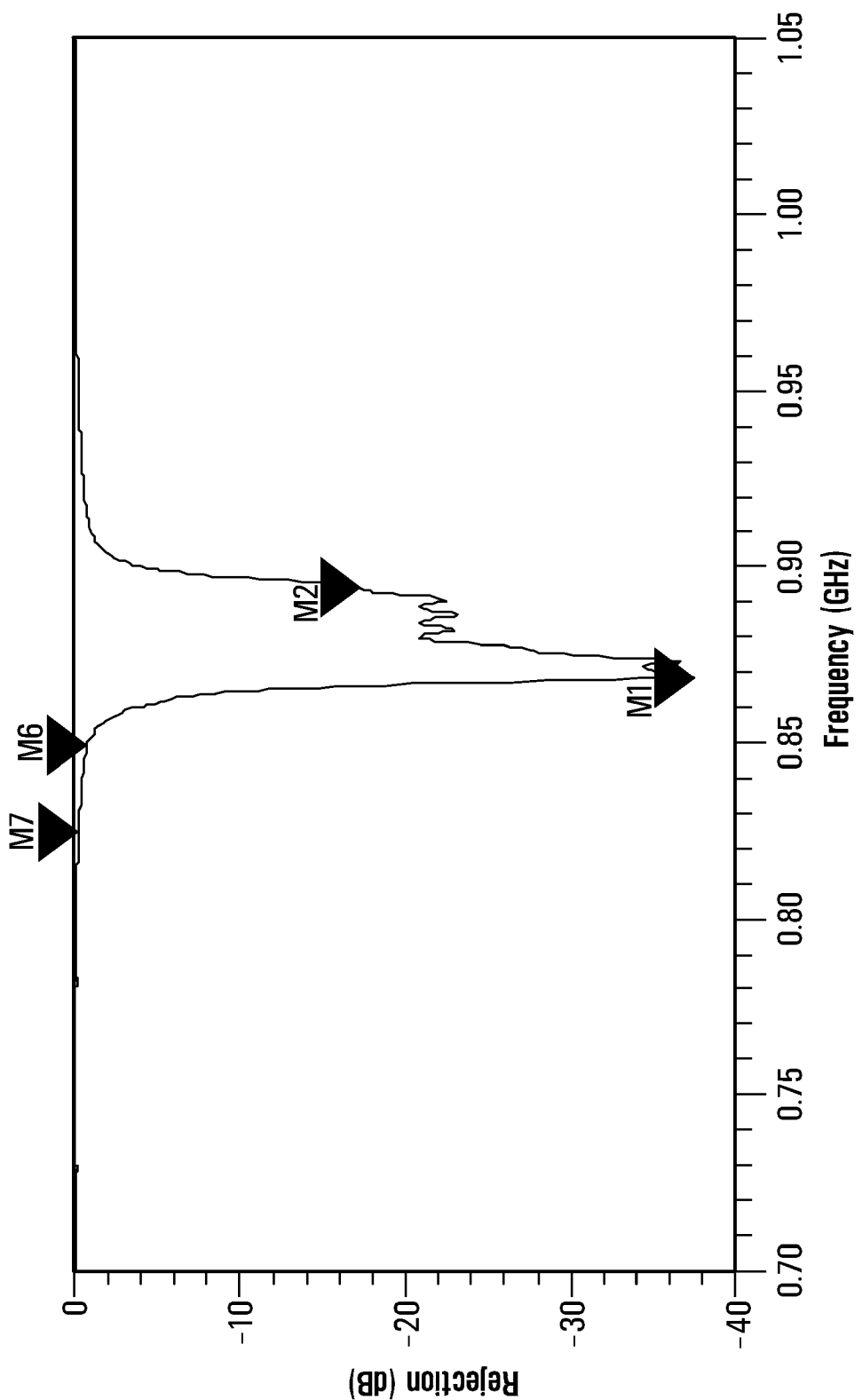
FIG. 16 is a simulated response characteristic for a shunt multipole filter of the type shown in FIG. 15.

FIG. 16 is a simulated response characteristic for a shunt multipole filter of the type shown in FIG. 15. The characteristic shown in FIG. 16 was generated by simulating the filter of FIG. 15 with duplicate 869 and 874 MHz resonators to enhance the rejection band on the low side. For the purposes of simulation, the resonators Res51 through Res57 were set to resonate at 869 MHz, 874 MHz, 877 MHz, 881 MHz, 886 MHz, 890 MHz, and 895 MHz, respectively, and the resonators Res58 and Res59 were respective duplicates of the resonators Res51 and Res52. This results in the enhanced rejection on the low side of the rejection band as illustrated in FIG. 16 and as summarized in Table 1:

TABLE 1

| Trace Marker | Frequency (MHz) | Rejection (dB) |
|---|---|---|
| m1 | 868.9 | −37.414 |
| m2 | 894.0 | −17.229 |
| m6 | 849.0 | −0.783 |
| m7 | 824.0 | −0.263 |

Of course, other rejection band frequencies and responses may be generated by using resonators with different resonance frequencies.

Figure 17:
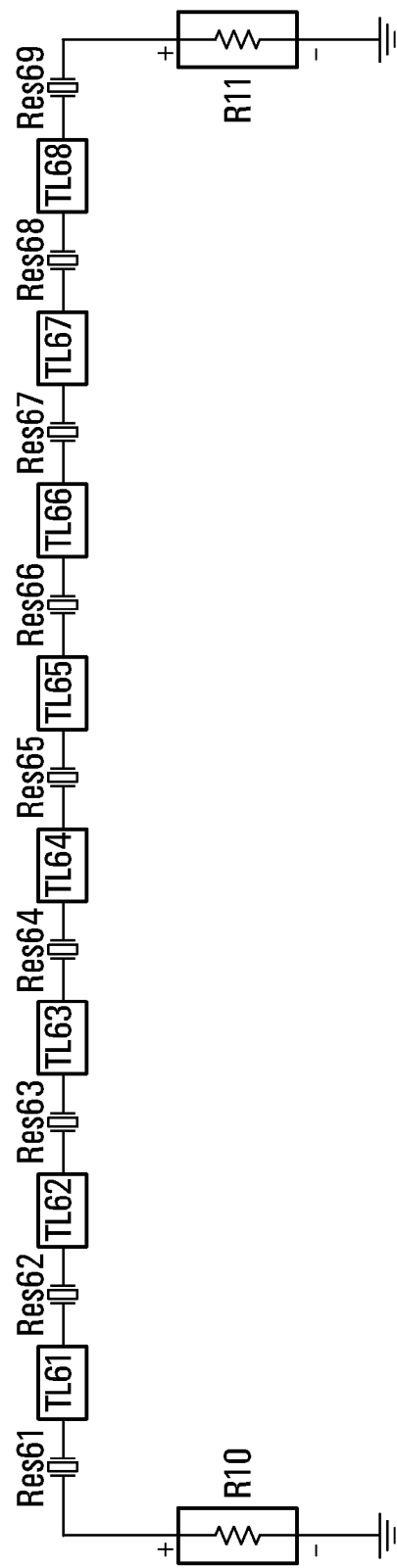
FIG. 17 is a schematic diagram of a series multipole band reject filter according to another embodiment of the invention.

FIG. 17 is a schematic diagram of a series resonator implementation of a multipole band reject filter. The filter of FIG. 17 is substantially similar to the filter of FIG. 15, but includes series resonators Res61 to Res69, instead of shunt resonators, connected through quarter-wave transmission lines TL61 to TL68 with terminal resistors R10 and R11. The filter of FIG. 17 operates in a substantially similar manner as the filter described in respect to FIG. 4 but allows the tuning of the multiple resonators Res61 to Res69 as described in connection with FIG. 15.

The above illustrative embodiments of the invention, with the exception of the filter shown in FIG. 14, include single resonators connected through phase shifters. However, groups of resonators may also be connected in a substantially similar manner.

Figure 18:
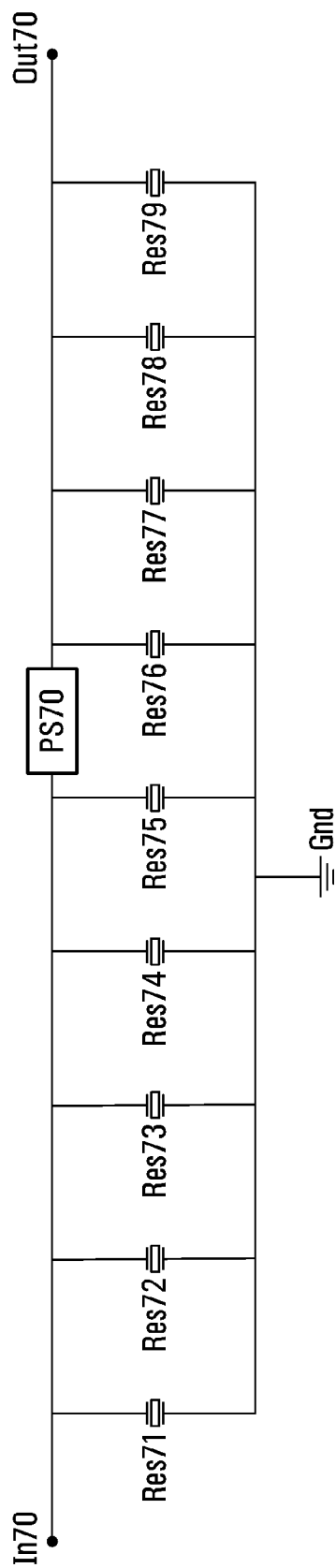
FIG. 18 is a schematic diagram of a grouped resonator band reject filter according to an embodiment of the invention.

FIG. 18 is a schematic diagram of an example of such a grouped resonator filter. In FIG. 18, a first group of shunt resonators Res71 to Res75 are connected in parallel and thereby grouped together, and a second group of shunt resonators Res76 to Res79 are similarly grouped by parallel connection. The first group of shunt resonators Res71 to Res75 and the second group of shunt resonators Res76 to Res79 are connected through a phase shifter 70 between an input In70 and an output Out70 as described in connection with FIG. 1. More generally, N resonators may be grouped together and connected through a phase shifter to a group of M resonators, where N and M may or may not be equal. Although connected in parallel, grouped resonators need not necessarily be on the same die when the filter is implemented on an integrated circuit.

In a grouped resonator filter, each resonator generates a low impedance to ground at its own resonance frequency. Anti-resonance here is a high impedance to ground and is of little interest. At frequencies away from resonance & anti-resonance frequencies, the filter acts like a capacitor to ground. Additional capacitance to ground has little impact on the resonance frequencies of individual resonators.

Grouped resonator filters work very well in shunt implementations. Parallel connection of series resonators generally provides only one anti-resonance frequency at which high impedance is generated.

Figure 19:
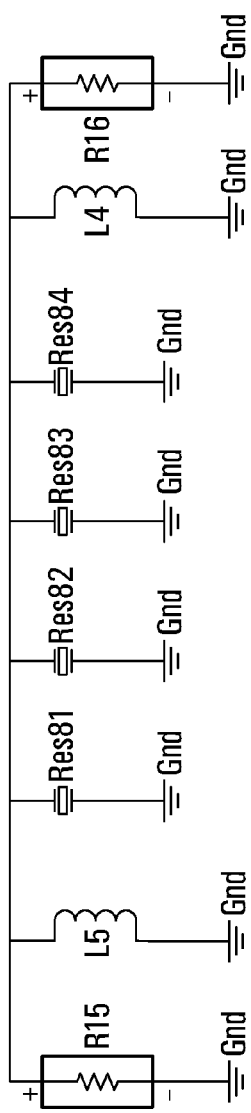
FIG. 19 is a schematic diagram of a circuit in which four shunt resonators are connected in parallel.

The effect of a phase shifter between resonators is further explained with reference to FIGS. 19 to 24. FIG. 19 is a schematic diagram of a circuit in which four shunt resonators Res81 to Res84 are connected in parallel without phase shifters. Also included are input/output resistors R15 and R16 and inductors L4 and L5. The multiple resonances to ground provided by the four shunt resonators Res81 to Res84 connected in parallel can be seen as low impedance resonances on a Smith chart, as shown in FIG. 20.

In the Smith chart, the circles correspond to a constant real impedance. The small circle on the right is 100 Ohms, the center circle is 50 Ohms and the larger circles 25 Ohms. The edge of the Smith chart is 0 Ohms. Horizontal lines represent imaginary inductive or capacitive impedance. The center is zero. Above a center line is inductive impedance with higher inductance as you move up. Capacitive impedances are below the center line with more capacitance as you move down. The horizontal arc lines projecting from the right correspond to constant capacitive or inductive impedance.

Figure 20:
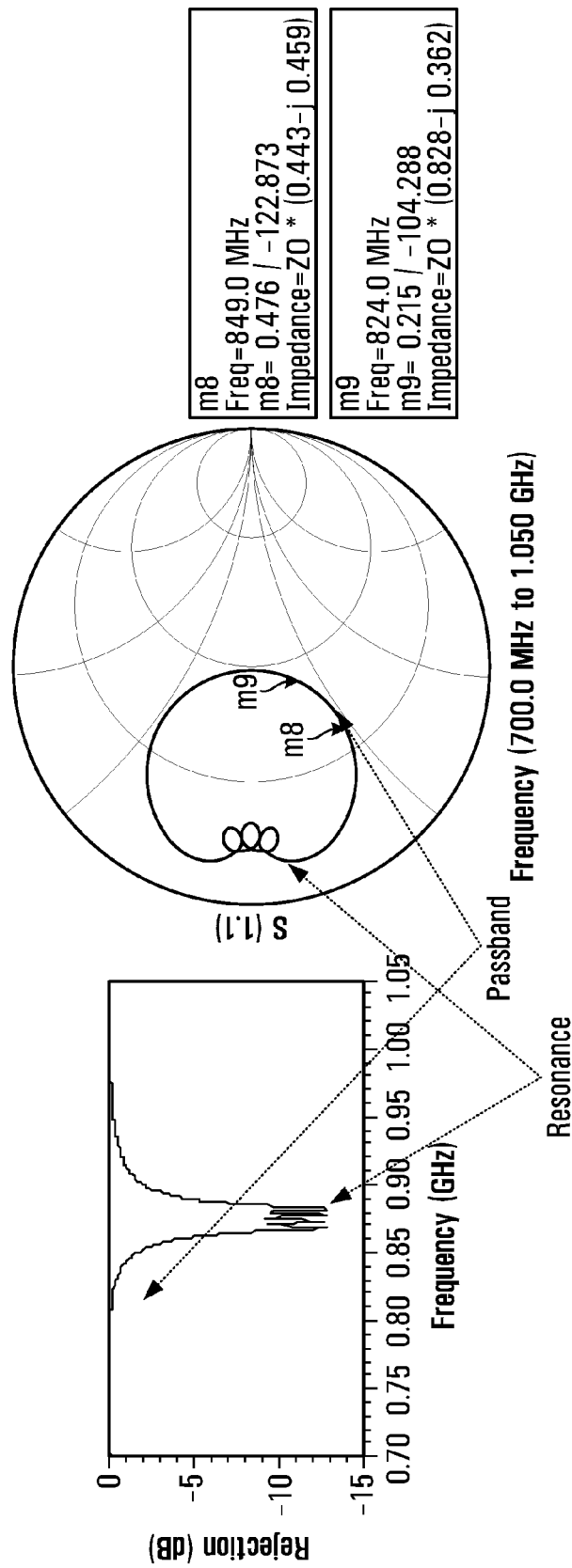
FIG. 20 illustrates a simulated response characteristic and Smith chart for the circuit of FIG. 19.

FIG. 20 shows the correlation of the Smith chart to simulated response characteristics. In the pass band, defined by the range between the markers m8 and m9, rejection is low. At the marker m8, the frequency is 849 Mhz and the rejection is 0.476 dB. Similarly, at the marker m9, the frequency is 824 Mhz and the rejection is 0.215 dB. At the resonance frequencies, of the resonators Res81 to Res84, the rejection is much greater. In the S21 response, the resonances show up as zeros.

Figure 21:
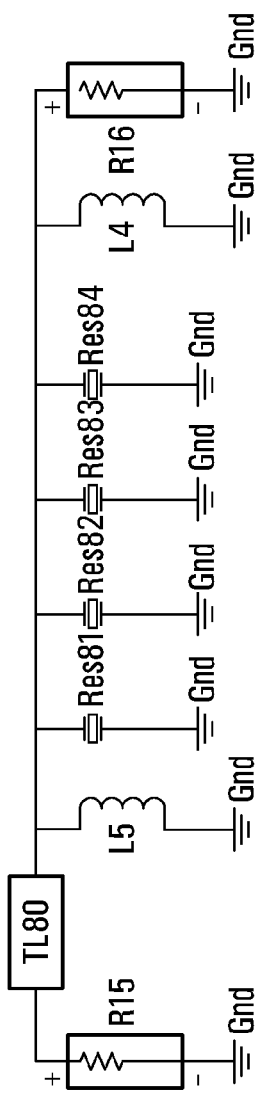
FIG. 21 is a schematic diagram of the circuit of FIG. 19 with an added phase shifter.
Figure 22:
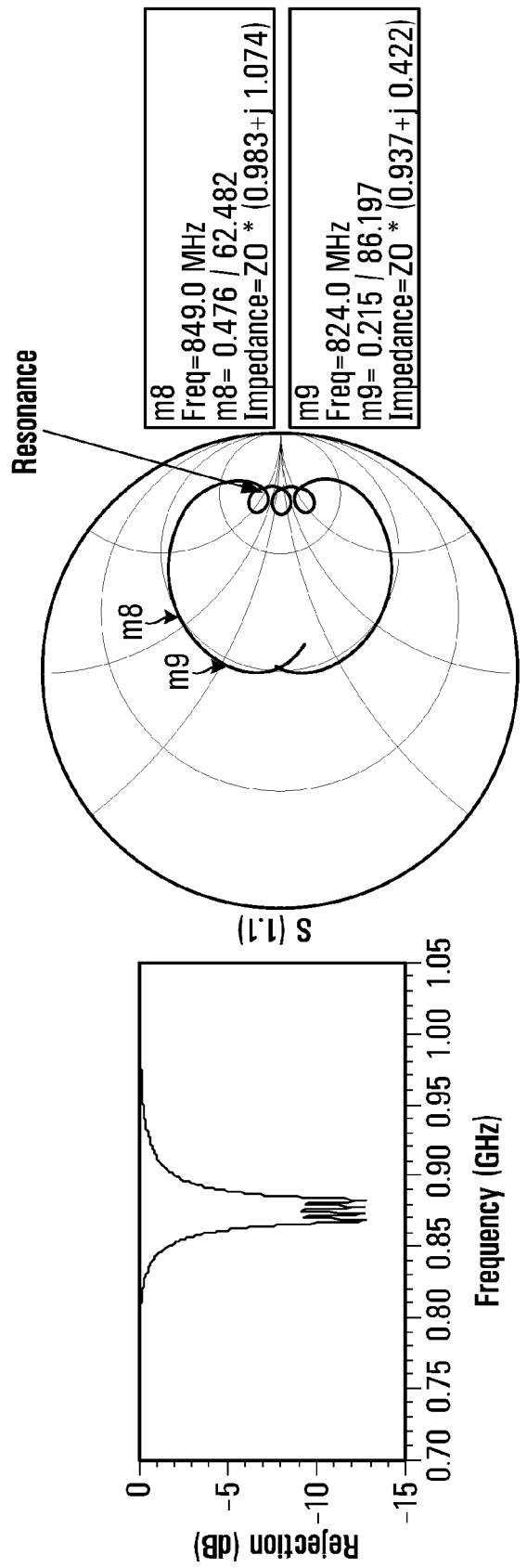
FIG. 22 illustrates a simulated response characteristic and Smith chart for the circuit of FIG. 21.

FIG. 21 is a schematic diagram of the circuit of FIG. 19 with an added phase shifter TL80 located before the resonators. FIG. 22 shows a simulated response characteristic and Smith chart for the resonant circuit of FIG. 21.

With four shunt resonators connected in parallel and a phase shifter located as shown in FIG. 21, the resonant circuit exhibits substantially the same amplitude response as the circuit of FIG. 19 (compare simulated response characteristics shown in FIGS. 20 and 22). However, from the point of view of looking through the phase shifter TL80, the Smith chart in FIG. 22 clearly shows that the 4 shunt resonances Res81 to Res84 have been rotated from the low impedance side (Smith chart of FIG. 20) to the high impedance side of Smith chart. The markers m8 and m9 in FIG. 22 defining the pass band have also been rotated. In the Smith chart of FIG. 20, the markers represented a capacitive load of about 50 ohms. In FIG. 22, the impedances corresponding to the markers are inductive and are close to the complex conjugates of the capacitive loads of FIG. 20.

Figure 23:
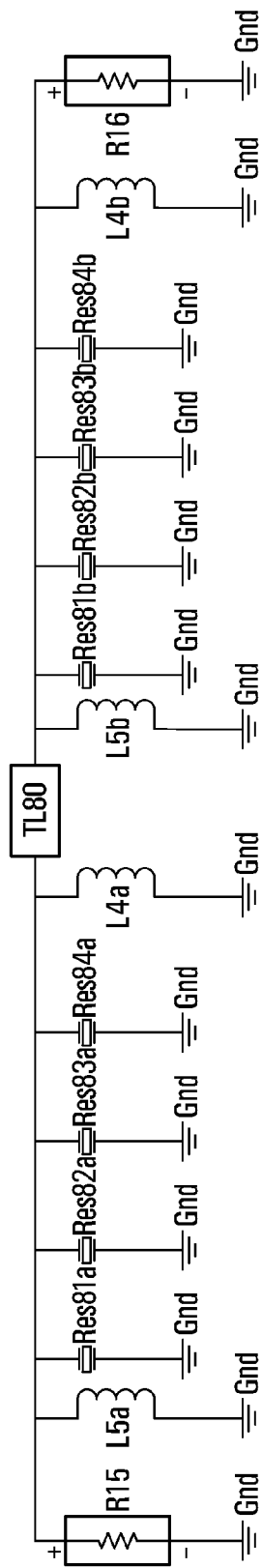
FIG. 23 is a schematic diagram of a band reject filter which includes two of the circuits shown in FIG. 19 connected through a phase shifter.
Figure 24:
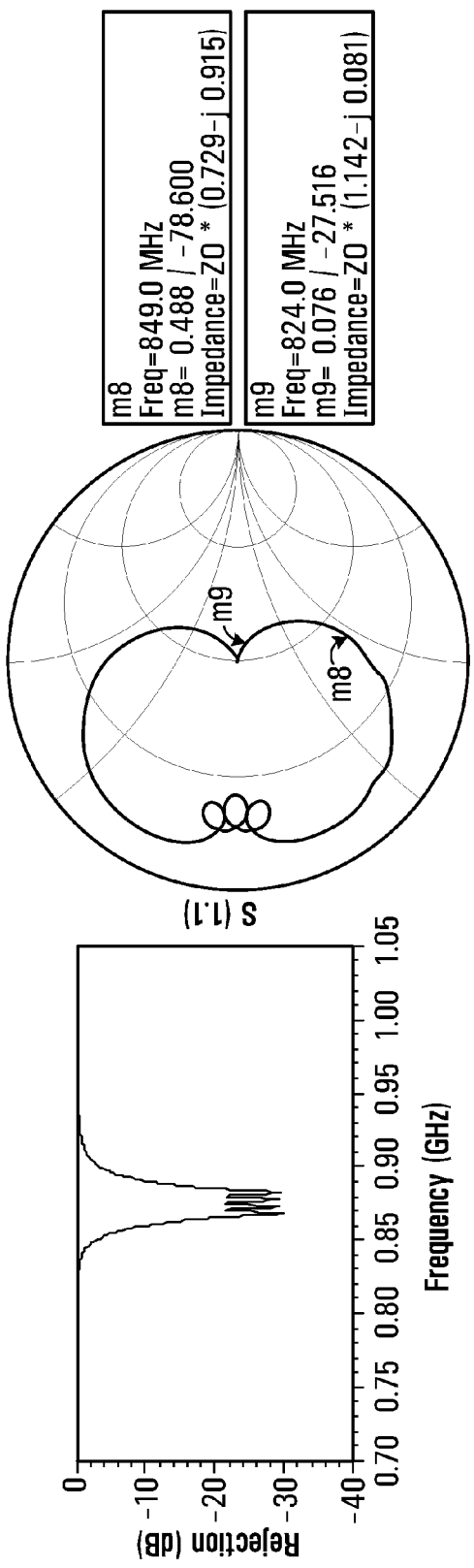
FIG. 24 illustrates a simulated response characteristic and Smith chart for a filter of the type shown in FIG. 23.

FIG. 23 is a schematic diagram of a band reject filter which includes two of the resonant circuits shown in FIG. 19, the first comprising shunt resonators Res81a to Res84a and inductors L4a and L5a and the second comprising shunt resonators Res81b to Res84b and inductors L4b and L5b, connected through a phase shifter in the form of a quarter-wave transmission line TL80. FIG. 24 shows simulated response characteristics and Smith chart for a filter of the type shown in FIG. 23. As illustrated in FIG. 24, the rejection band of the filter of FIG. 23 is improved from approximately −9 dB to approximately −23 dB relative to the rejection bands of the resonant circuits of FIGS. 19 and 21. An improved pass band response of the filter of FIG. 23 can also be observed from a comparison of the response characteristics of FIGS. 20, 22, and 24. The filter of FIG. 23 exhibits a near ideal match on the low side of the pass band.

In FIGS. 19 to 24, the phase shifter has been adjusted to rotate the rejection band (resonances of the shunt resonators) to provide an impedance inversion. In so doing the pass band (denoted by the markers m8 and m9) of one group of resonators Res81b-Res84b is rotated to become inductive and thereby tune out the capacitive pass band impedance of the other group of resonators Res81a-Res84a. At the marker m9 the rotation almost provides a complex conjugate but the response at the marker m8 is slightly over rotated. Had the amount of phase shift been decreased, the pass band response at the marker m8 could have been improved but at a slight expense to the rejection band depth since the rejection band depicted by the resonances on the Smith chart in FIG. 22 would now have been insufficiently rotated on the Smith chart.

In the foregoing description, the term "phase shifter" has been used to generally refer to a component which imparts a phase shift or rotation of between 45° and 135°; at 90° of rotation, a phase shifter acts as an impedance inverter. Examples of such as phase shifter include quarter-wave transmission lines and various types of couplers and splitters/combiners. Discrete phase shifter can also be created using lumped elements. At lower frequencies and other operating conditions in which a distributed phase shifter would be too large, for example, discrete impedance inverters may be preferred. Virtually any implementations of such phase shifter may be provided in conjunction with acoustic resonators to provide band reject filters according to embodiments of the invention.

Typical examples of discrete impedance inverters can be seen in FIGS. 28a to 28d comprised of inductors L, capacitors C and ground G. These are four well known topologies which will yield an impedance inversion. For each structure the value of the capacitors and inductors can be approximated as follows:

$$L = \frac{Z_o}{2\pi * f_o} \quad \text{Eqn: 1}$$

$$C = \frac{1}{2\pi * f_o * Z_o} \quad \text{Eqn: 2}$$

The value of the capacitance and inductance may vary slightly in an attempt to optimize either the pass band or rejection band. In some instances it may be beneficial to incorporate the value of the SAW or FBAR static capacitance into the value of the required capacitance defined in Eqn. 2. The band reject filters described above can be designed on a large variety of substrates depending on the application and targeted specifications. For example, those skilled in the art will appreciate that the term "SAW" can be extended beyond the classical Rayleigh wave and also encompasses Leaky SAWs, Surface Skimming Bulk Waves and Surface Transverse Waves.

In general, the type of wave will depend on the substrate chosen. A few examples of substrates supporting the classical Rayleigh mode are ST Quartz, YZ Lithium Niobate, 128 degree cut X-axis Lithium Niobate, X-cut 112.2 Y-direction Lithium Tantalate to name a few. Examples of substrates supporting leaky surface acoustic waves are LST Quartz, 64 degree YX Lithium Niobate and 36 to 42 degree YX Lithium Tantalate. Examples of substrates supporting surface skimming bulk waves are Rotated Y-cut ST-quartz, 35.5 degree (AT) rotated Y-cut quartz and 36 degree rotated YX-Lithium Tantalate.

Furthermore, acoustic resonators may be designed on multi-layer substrates such as, but not limited to, Lithium Tantalate with a SiO2 layer or a diamond substrate consisting of Si/Diamond/ZnO/Al/SiO2 such as that presently being developed by Sumitomo.

Figure 25:
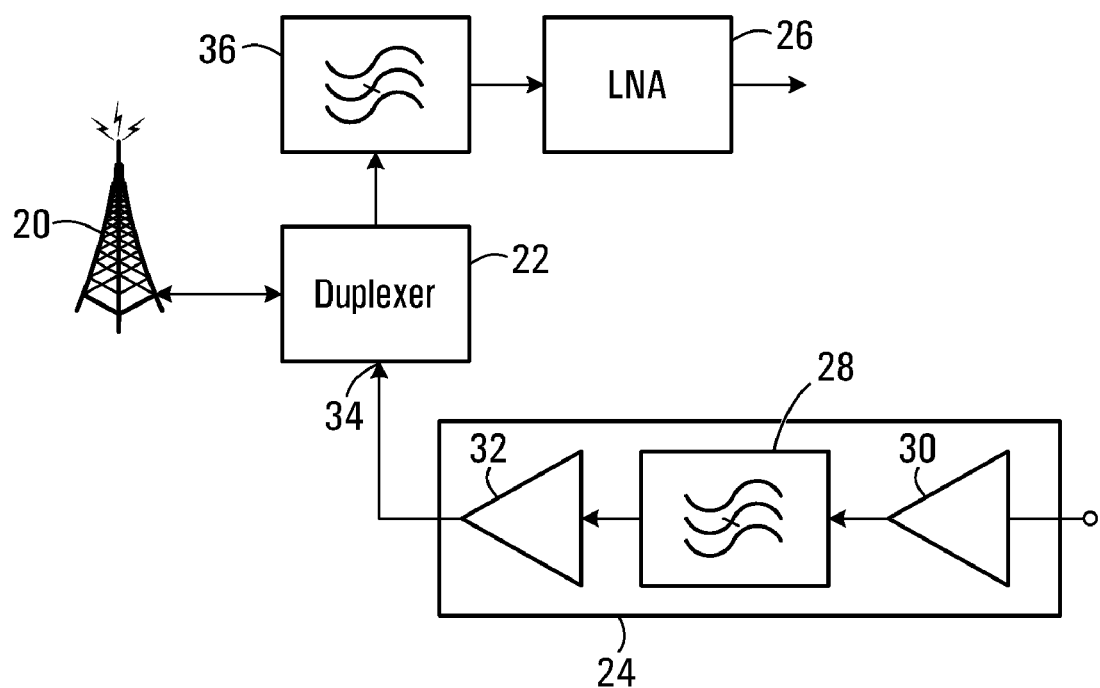
FIG. 25 is a block diagram of a network element for a wireless communication system in which band reject filters in accordance with embodiments of the invention may be implemented.

Turning now to possible applications of the type of filters shown in the drawings and described herein, FIG. 25 is a block diagram of a network element for a wireless communication system in which band reject filters in accordance with embodiments of the invention may be implemented. The network element of FIG. 25 is a base station for a cellular mobile radio network.

The antenna 20 is used to transmit signals to and receive signals from mobile communication terminals, illustratively handsets, at different respective frequencies. A duplexer 22 is used to feed signals in a transmit band from a power amplifier 24 to the antenna 20, and to feed signals in a receive band from the antenna 20 to an LNA 26.

An acoustic resonator band reject filter 28 is connected between amplifier stages 30 and 32 of the power amplifier 24, and is used to reject frequencies in the receive band. This reduces the energy present in the receive band at the input 34 to the duplexer 22.

Another acoustic resonator band reject filter 36 is tuned to reject the transmit band at the input stage to the LNA 26.

By incorporating the filters 28 and 36 into a network element, the operating margins of the duplexer 22 may be reduced, since the sensitivity of the LNA to energy in the transmit band is reduced by the filter 36. The likelihood of the power amplifier 24 introducing energy in the receive band into the duplexer 22 is also reduced by the filter 28. Thus the cost of the duplexer 22 may be reduced, resulting in a significant cost saving in the overall cost of the network element.

It will be appreciated that although FIG. 25 shows two amplifier stages 30 and 32 and a single interstage filter 28, the number of amplifier stages and the number of interstage filters may vary from that shown. Similarly, the representation of the band reject filter 36 and the single LNA 26 is intended only to represent one possible example of the use of filter according to embodiments of the present invention.

Those skilled in the art will also appreciate that a communication terminal such as a mobile telephone handset may incorporate a duplexer which is similar in operation to the duplexer 22 of FIG. 25. The purpose of the duplexer is to allow simultaneous transmission and reception in different frequency bands using the same antenna while ensuring that relatively high power transmit signals do not swamp the received signals which are to be amplified by the LNA. Thus, it is possible to use band reject filters of the type disclosed herein in either or both of network elements such as base stations and communication terminals such as handsets.

As discussed previously, LNA and PA circuitry often employ Quadrature couplers or Wilkinson Combiners to join multiple transistors. There are many advantages to such implementations such as the improved return loss provided by the quadrature combiners, a 3 dB improvement in achievable powers or linearity etc.

Figure 26:
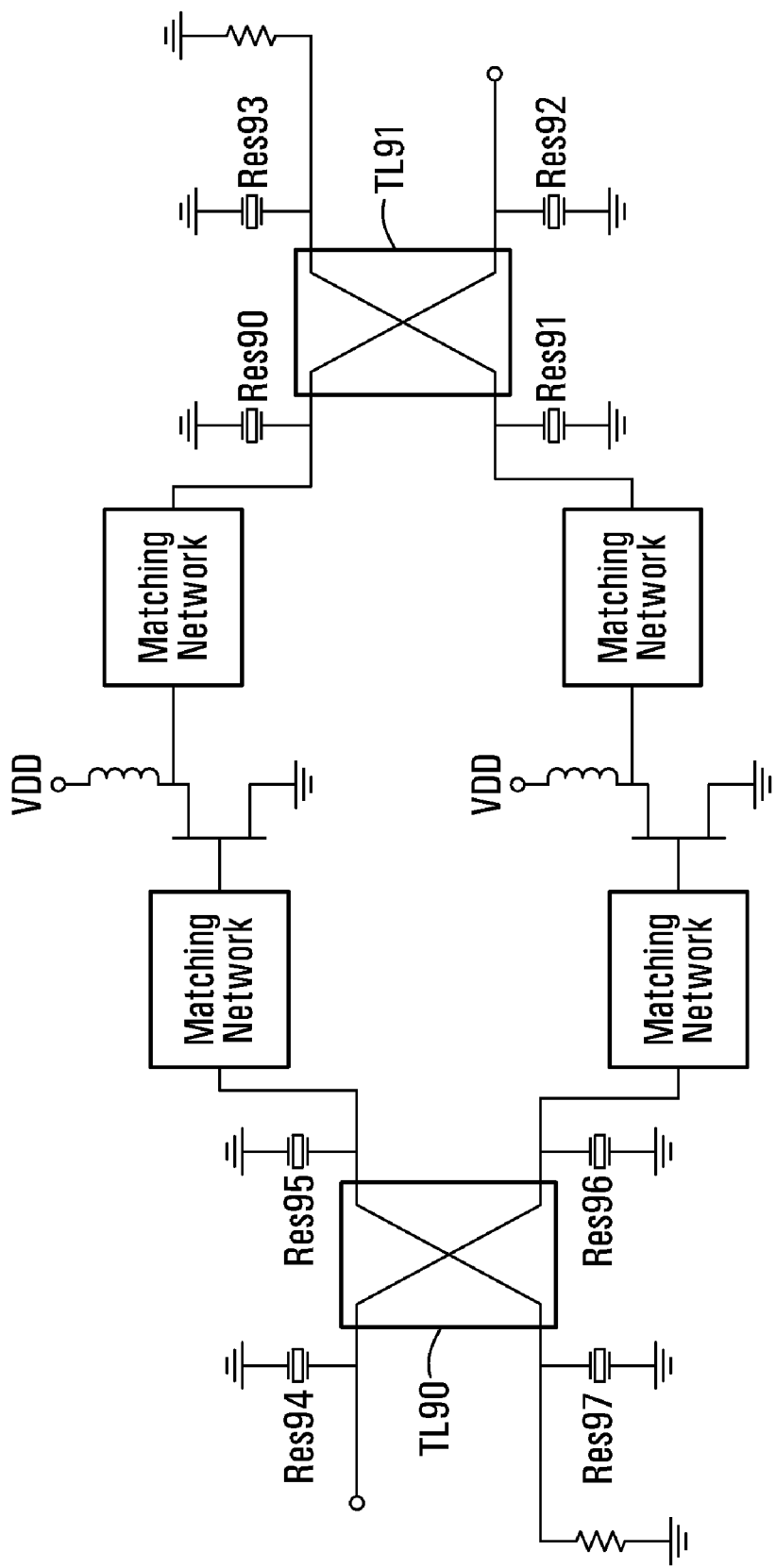
FIG. 26 is a block diagram of a power amplifier or LNA (Low Noise Amplifier) circuit featuring a band reject filter according to an embodiment of the invention.

FIG. 26 depicts an LNA or PA circuit implemented with Quadrature couplers at its input and output. LNA's or PA's are often implemented using Quadrature couplers to ensure a good input and output match, as well as improved sensitivity and linearity. The operation of the basic circuit, including the Matching Networks and voltage source $V_{DD}$, will be understood by those skilled in the art. In this particular implementation band reject filters have been designed around the quadrature couplers by locating pairs of resonators Res94 and Res96, Res95 and Res97, Res90 and Res92, and Res91 and Res93 on opposite sides of quarter-wave transmission lines TL90 and TL91.

Figure 27:
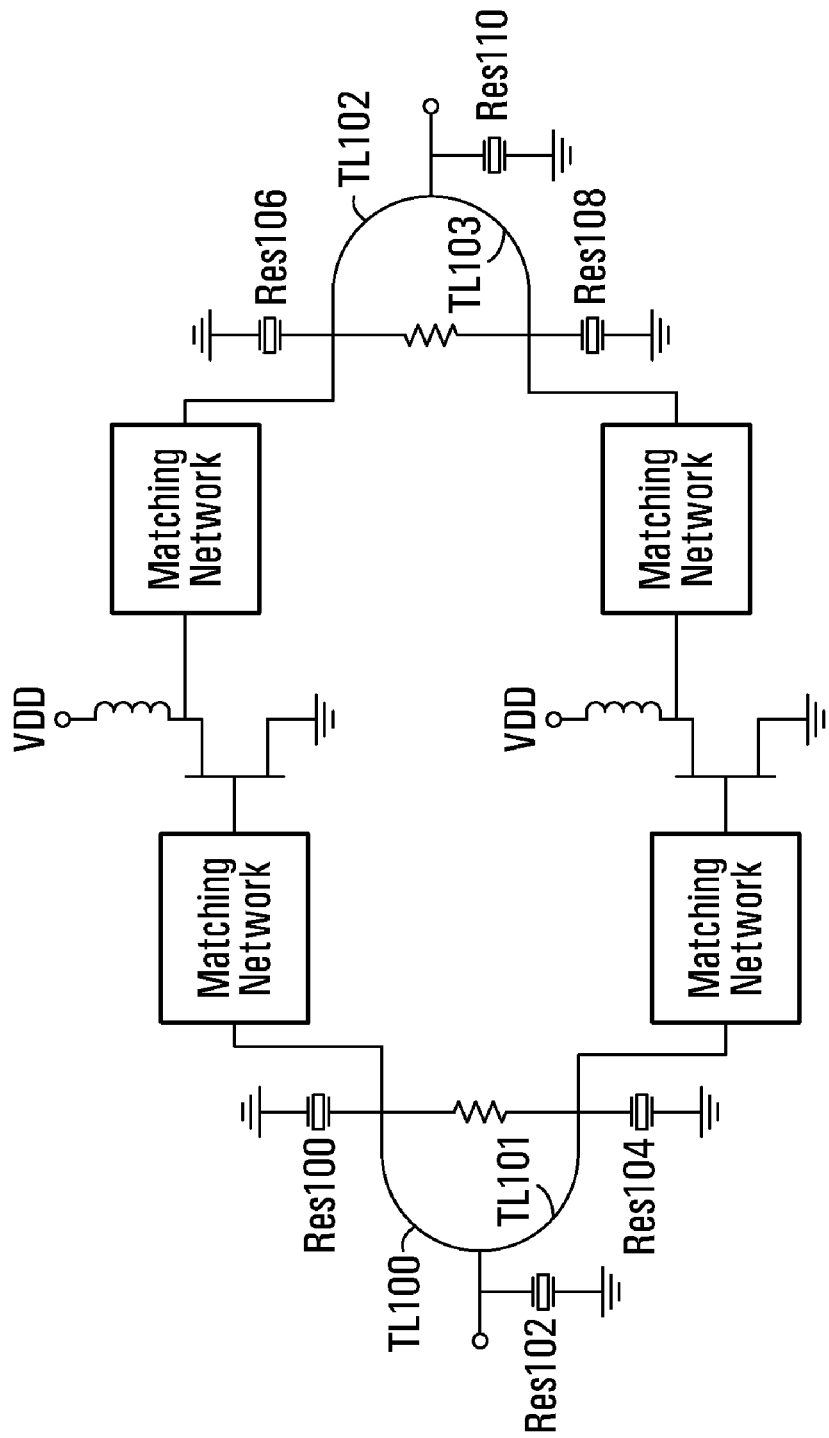
FIG. 27 is a block diagram of a power amplifier or LNA circuit featuring a band reject filter according to an embodiment of the invention.
Figure 28A:
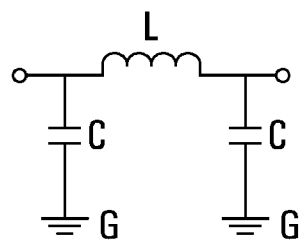
FIGS. 28a to 28d shows representations of lumped element quarter-wavelength approximations.
Figure 28C:
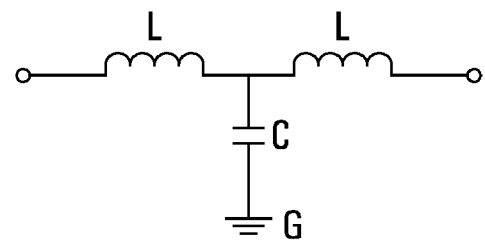
Figure 28B:
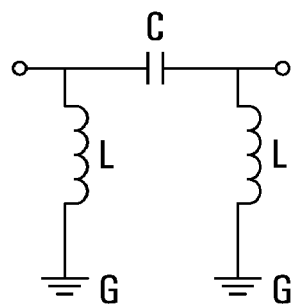
Figure 28D:
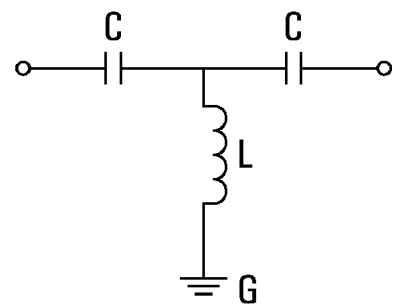

FIG. 27 depicts either an LNA or PA circuit using Wilkinson combiners to link two gain stages in parallel. A band reject filter in designed around the Wilkinson combiners at both the input and output of the gain block by locating pairs of resonators Res100 and Res102, Res104 and Res102, Res106 and Res110, and Res108 and Res110 on opposite sides of quarter-wave transmission lines TL100, TL101, Tl102 and TL103. Using the impedance inverters already existing in the LNA or PA circuit minimizes RF loss and reduces space requirements.

Although FIGS. 26 and 27 show band reject filter according to the invention on both the input and the output, it will be understood that a band reject filter may be provided on only the input or only the output.

It should be noted that the band reject filter may also be used to reject other sources of interference, from the aircraft band for instance.

Various filters according to embodiments of the invention have been described above, and provide additional filter design flexibility which can be quite valuable. In one instance when designing an Interference Mitigation Filter it may be desirable to allow a DC power signal of a few volts to propagate through the filter. In Base station environments a DC signal is often fed from the Antenna port of the BTS, up the antenna feeder, to a module at the mast head. Examples of such scenarios may be when tower top amplifiers are used or programmable tilt antennas. In such a case the ability to design the filter using exclusively shunt resonators would greatly facilitate this task since any DC signal applied to the input port would have a direct DC path to the output port.

In other instances it may be possible to design a shunt or series resonator with the desired transfer function or power handling characteristics but not both. In such a case the ability to synthesis a desired filter using exclusively series or shunt resonators would be advantageous. In a high power application a series resonator may be undesirable since the resonator would need to pass the full RF power incident upon it. On the other hand, a shunt resonator need only survive the potential difference between the RF track and ground but does not need to pass the RF current.

In a scenario where the high side of the rejection band will be subjected to elevated RF powers it would be desirable to have little or no acoustic resonance on the high side of the rejection band. In such a case using only series resonators would be advantageous. Series resonators would be at their anti-resonance state within the rejection band. Above the rejection band the resonators would look like a capacitor and would be able to withstand significantly higher powers than a device which exhibits a strong acoustic response over this frequency range. Shunt resonators would be undesirable since within the rejection band they would be at their resonance frequency, and therefore above the rejection band they would be at their anti-resonance frequency. Since the shunt devices would exhibit large acoustic resonance (ie: since they are at their anti-resonance frequency) over the pass band they would be unable to withstand large RF powers.

Conversely, in a scenario where the low side of the pass band will be subjected to elevated RF powers it would be advantageous to use shunt resonators exclusively. The shunt resonators would form the rejection band at their resonance frequency. Below their resonance frequency the devices behave as capacitors will little or no acoustic response. The anti-resonance frequency of these resonators would be above the actual resonance frequency, away from the elevated RF powers located at a frequency below the rejection band. Since the devices behave as capacitors below the rejection band, which is formed by the resonance of the shunt resonators, the pass band of the device is formed primarily by the interdigital capacitance of the transducers with impedance inverters to match successive devices. Since there is no acoustic resonance in the pass band the filter can withstand significantly larger RF powers within its pass band than a comparable pass band filter. The failure mechanism for this device would be arcing rather than acousto-electric migration due to the lack of acoustic resonance in its pass band.

What has been described is merely illustrative of the application of the principles of the invention. Other arrangements and methods can be implemented by those skilled in the art without departing from the scope of the present invention.

For example, the invention is in no way limited to any particular component values and response characteristics shown in the drawings and/or described herein. These values and characteristics are provided solely for illustrative purposes.

We claim:

1. A radio frequency band reject filter, comprising:
a splitter having a first input port, a first output port and a second output port, the splitter being operable on an input signal applied to the first input port to provide a respective output signal proportional to the input signal at each of the first and second output ports, the output signals having a phase shift between 45 degrees and 135 degree with respect to the input signal;
first, second and third acoustic resonators coupled respectively to the first input port, the first output port and the second output port.

2. The filter as defined in claim 1, wherein at least one of the acoustic resonators is a shunt resonator operable to resonate substantially at a resonance frequency defining a rejection frequency band.

3. The filter as defined in claim 1, wherein at least one of the acoustic resonators is a series resonator operable to anti-resonate substantially at an anti-resonance frequency defining a rejection frequency band.

4. The filter as defined in claim 1, wherein the splitter comprises a Wilkinson combiner.

5. The filter as defined in claim 4, wherein the Wilkinson combiner comprises:
   a first quarter-wave transmission line coupled between the first input port and the first output port;
   a second quarter-wave transmission line coupled between the first input port and the second output port; and
   an impedance coupled between the first input port and the second output port.

6. The filter as defined in claim 1, wherein the splitter comprises a quadrature coupler.

7. The filter as defined in claim 6, wherein:
   the quadrature coupler comprises a second input port; and
   the filter further comprises a fourth acoustic resonator coupled to the second input port.

8. An amplifier, comprising:
   a band reject filter as defined in claim 6;
   a first amplifying element having an input coupled to the first output port of the splitter; and
   a second amplifying element having an input coupled to the second output port of the splitter.

9. An amplifier, comprising:
   a band reject filter as defined in claim 1;
   a first amplifying element having an input port coupled to the first output port of the splitter; and
   a second amplifying element having an input port coupled to the second output port of the splitter.

10. The amplifier as defined in claim 9, further comprising:
    a first matching network coupled between the first output port of the splitter and the input port of the first amplifying element;
    a second matching network coupled between the second output port of the splitter and the input port of the second amplifying element.

11. A radio frequency band reject filter, comprising:
    a combiner having a first input port, a second input port and a first output port, the combiner being operable on input signals applied to the first input port and the second input port to provide a respective output signal proportional to the input signals at the first output port, the output signal having a phase shift between 45 degrees and 135 degree with respect to the input signals;
    first, second and third acoustic resonators coupled respectively to the first input port, the second input port and the first output port.

12. The filter as defined in claim 11, wherein at least one of the acoustic resonators is a shunt resonator operable to resonate substantially at a resonance frequency defining a rejection frequency band.

13. The filter as defined in claim 11, wherein at least one of the acoustic resonators is a series resonator operable to anti-resonate substantially at an anti-resonance frequency defining a rejection frequency band.

14. The filter as defined in claim 11, wherein the combiner comprises a Wilkinson combiner.

15. The filter as defined in claim 14, wherein the Wilkinson combiner comprises:
    a first quarter-wave transmission line coupled between the first input port and the first output port;
    a second quarter-wave transmission line coupled between the second input port and the first output port; and
    an impedance coupled between the first input port and the first output port.

16. The filter as defined in claim 11, wherein the combiner comprises a quadrature coupler.

17. The filter as defined in claim 16, wherein:
    the quadrature coupler comprises a second output port; and
    the filter further comprises a fourth acoustic resonator coupled to the second output port.

18. An amplifier, comprising:
    a band reject filter as defined in claim 16;
    a first amplifying element having an output port coupled to the first input port of the combiner; and
    a second amplifying element having an output port coupled to the second input port of the combiner.

19. An amplifier, comprising:
    a band reject filter as defined in claim 11;
    a first amplifying element having an output port coupled to the first input port of the combiner; and
    a second amplifying element having an output port coupled to the second input port of the combiner.

20. The amplifier as defined in claim 19, further comprising:
    a first matching network coupled between the output port of the first amplifying element and the first input port of the combiner;
    a second matching network coupled between the output port of the second amplifying element and the second input port of the combiner.

* * * * *

UNITED STATES PATENT AND TRADEMARK OFFICE
CERTIFICATE OF CORRECTION

| | |
|---|---|
| PATENT NO. | : 8,004,371 B2 |
| APPLICATION NO. | : 12/856757 |
| DATED | : August 23, 2011 |
| INVENTOR(S) | : Steve Beaudin et al. |

It is certified that error appears in the above-identified patent and that said Letters Patent is hereby corrected as shown below:

Title Page item 57
In the abstract, on line 14, "…operable on an input signals…" should be --…operable on input signals…--; and
Column 1, line 9, "…No. PCT/CA2005/001492filed on…" should be --…No. PCT/CA2005/004192 filed on…--.

Signed and Sealed this
Eighteenth Day of October, 2011

David J. Kappos
*Director of the United States Patent and Trademark Office*

UNITED STATES PATENT AND TRADEMARK OFFICE
CERTIFICATE OF CORRECTION

Page 1 of 1

PATENT NO.         : 8,004,371 B2
APPLICATION NO.    : 12/856757
DATED              : August 23, 2011
INVENTOR(S)        : Steve Beaudin et al.

It is certified that error appears in the above-identified patent and that said Letters Patent is hereby corrected as shown below:

Title Page item 57
In the abstract, on line 14, "...operable on an input signals..." should be --...operable on input signals...--; and
Column 1, line 9, "...No. PCT/CA2005/001492filed on..." should be --...No. PCT/CA2005/001492 filed on...--.

This certificate supersedes the Certificate of Correction issued October 18, 2011.

Signed and Sealed this
Third Day of April, 2012

David J. Kappos
*Director of the United States Patent and Trademark Office*